(12) United States Patent
Nelson et al.

(10) Patent No.: US 9,178,029 B2
(45) Date of Patent: *Nov. 3, 2015

(54) FORMING A VTFT GATE USING PRINTING

(71) Applicant: Eastman Kodak Company, Rochester, NY (US)

(72) Inventors: Shelby Forrester Nelson, Pittsford, NY (US); Carolyn Rae Ellinger, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/198,677

(22) Filed: Mar. 6, 2014

(65) Prior Publication Data

US 2015/0255558 A1   Sep. 10, 2015

(51) Int. Cl.
| | | |
|---|---|---|
| *H01L 29/423* | (2006.01) | |
| *H01L 21/3213* | (2006.01) | |
| *H01L 29/78* | (2006.01) | |

(52) U.S. Cl.
CPC .... *H01L 29/42384* (2013.01); *H01L 21/32133* (2013.01); *H01L 21/32139* (2013.01); *H01L 29/7827* (2013.01)

(58) Field of Classification Search
CPC .............. H01L 27/286; H01L 27/3244; H01L 27/3262
See application file for complete search history.

(56) References Cited

U.S. PATENT DOCUMENTS

| | | | |
|---|---|---|---|
| 5,766,988 A | 6/1998 | Cho et al. | |
| 6,458,633 B1 | 10/2002 | Cho | |
| 6,746,904 B2 | 6/2004 | Van der Zaag et al. | |
| 7,160,819 B2 | 1/2007 | Conley et al. | |
| 7,413,982 B2 | 8/2008 | Levy | |
| 7,456,429 B2 | 11/2008 | Levy | |
| 7,572,686 B2 | 8/2009 | Levy et al. | |
| 7,789,961 B2 | 9/2010 | Nelson et al. | |
| 7,998,878 B2 | 8/2011 | Levy et al. | |
| 8,017,183 B2 | 9/2011 | Yang et al. | |
| 2005/0084610 A1 | 4/2005 | Selitser | |
| 2006/0213957 A1 | 9/2006 | Addington et al. | |
| 2008/0166880 A1 | 7/2008 | Levy | |
| 2009/0051749 A1 | 2/2009 | Baker | |
| 2009/0078204 A1 | 3/2009 | Kerr et al. | |
| 2009/0081366 A1 | 3/2009 | Kerr et al. | |

(Continued)

FOREIGN PATENT DOCUMENTS

WO   WO 2008/082472   7/2008

OTHER PUBLICATIONS

Sinha, A. et al., "Area Selective Atomic Layer Deposition of Titanium Dioxide: Effect of Precursor Chemistry", J. Vac. Sci. Technol. B 24(6), pp. 2523-2532, Nov./Dec. 2006.

(Continued)

*Primary Examiner* — Mohammad Choudhry
(74) *Attorney, Agent, or Firm* — William R. Zimmerli

(57) ABSTRACT

A method of forming a gate layer of a thin film transistor includes providing a substrate including a gate structure having a reentrant profile. A conformal conductive inorganic thin film is deposited over the gate structure. A polymeric resist is printed that wicks along the reentrant profile of the gate structure. The conformal conductive inorganic thin film is etched in areas not protected by the polymeric resist to form a patterned conductive gate layer located in the reentrant profile of the gate structure.

8 Claims, 27 Drawing Sheets

(56) References Cited

U.S. PATENT DOCUMENTS

2009/0081827 A1 3/2009 Yang et al.
2009/0130858 A1 5/2009 Levy

OTHER PUBLICATIONS

Sinha, A. et al, "A Top Surface Imaging Method Using Area Selective Ald on Chemically Amplified Polymer Photoresist Films", Electrochemical and Solid-State Letters, 9 (11), pp. G330-G333 (2006).

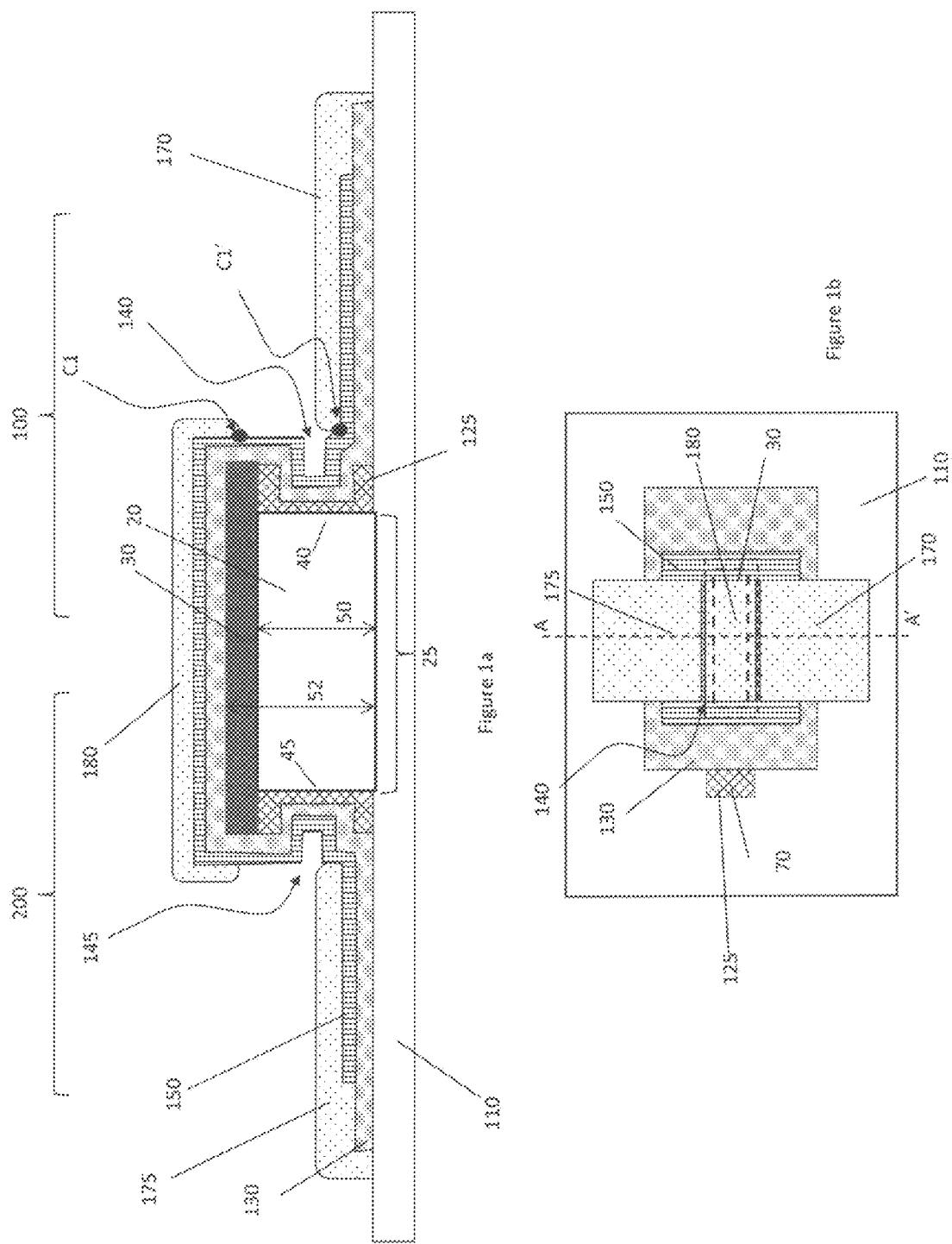

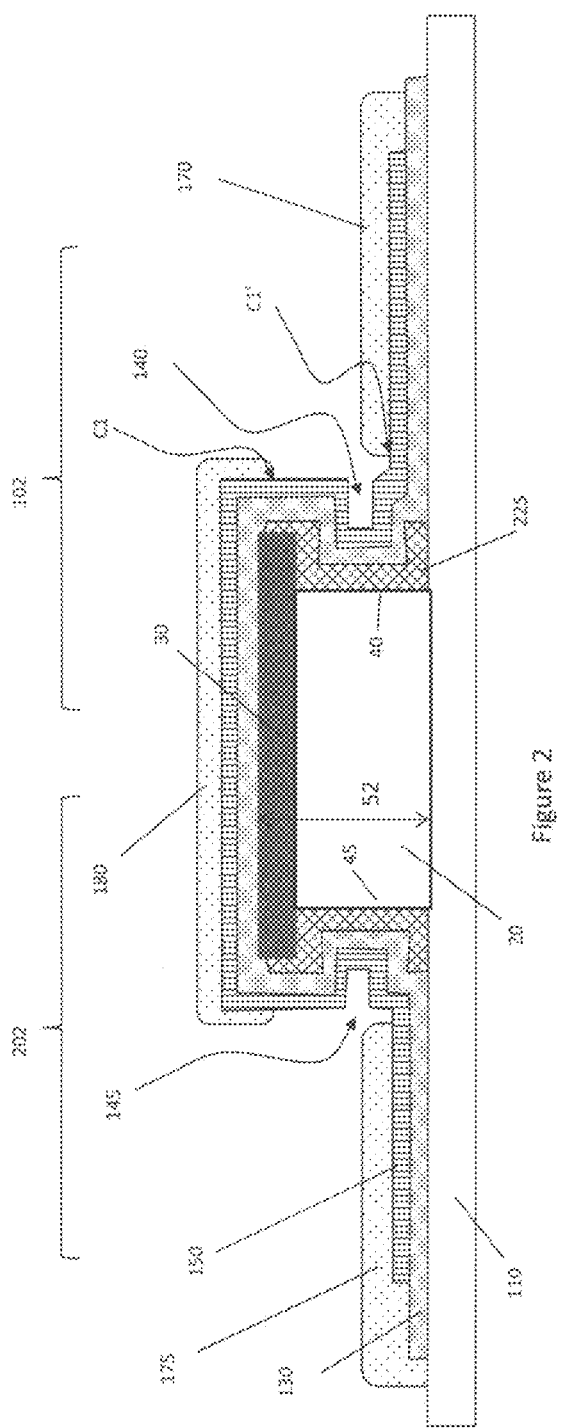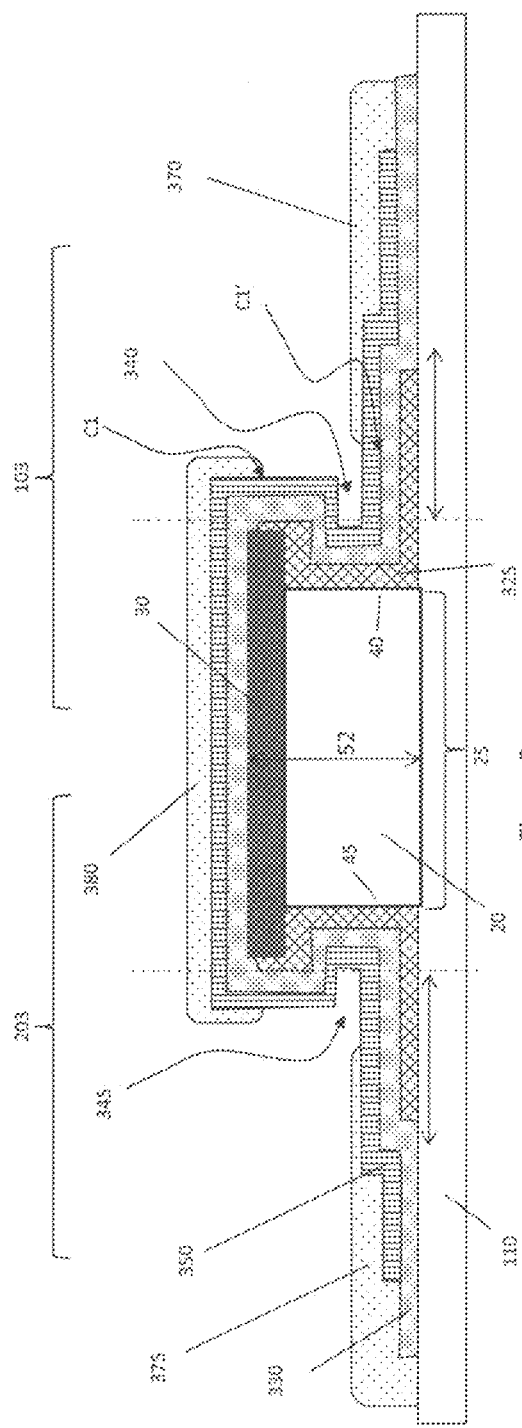

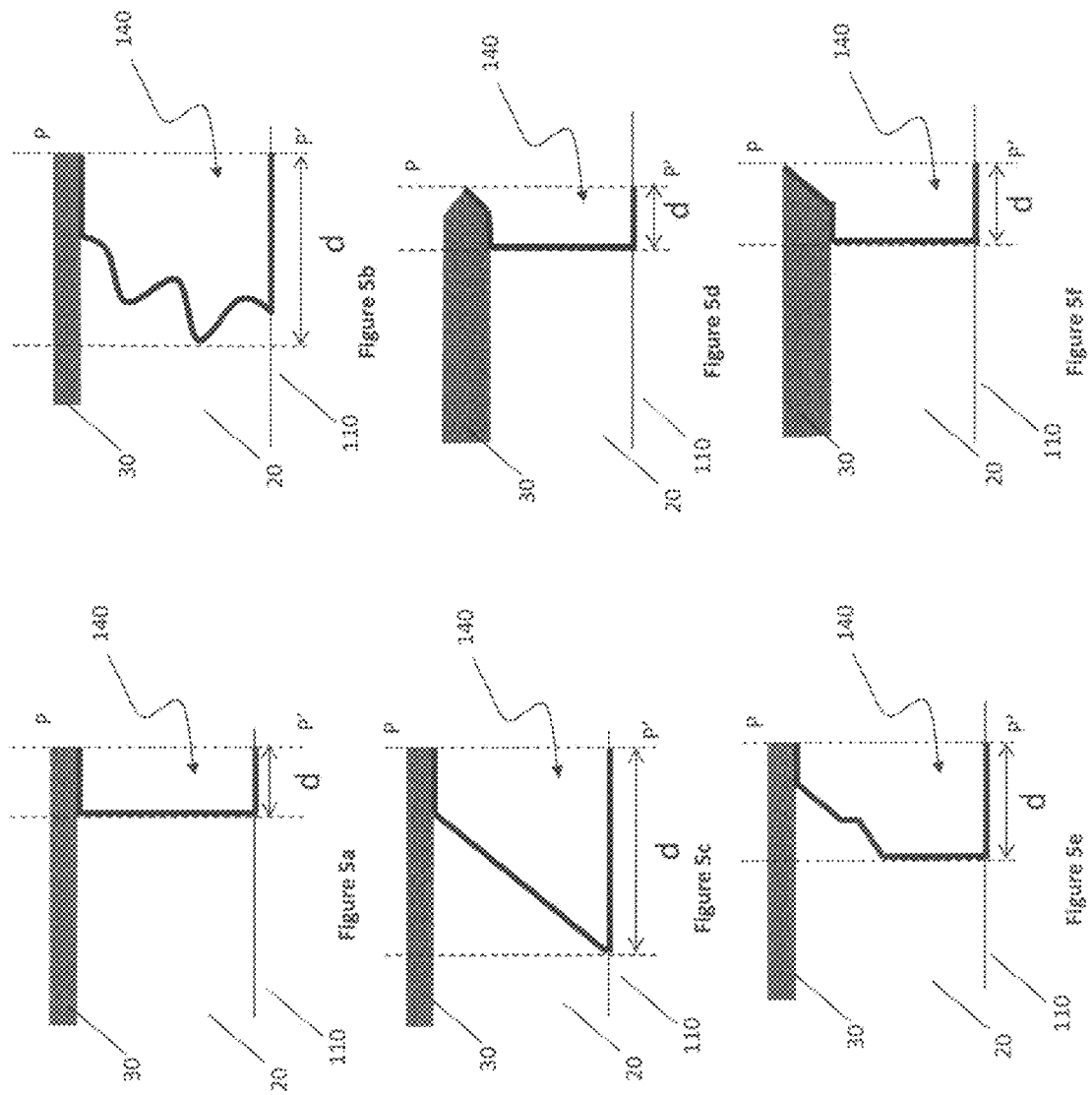

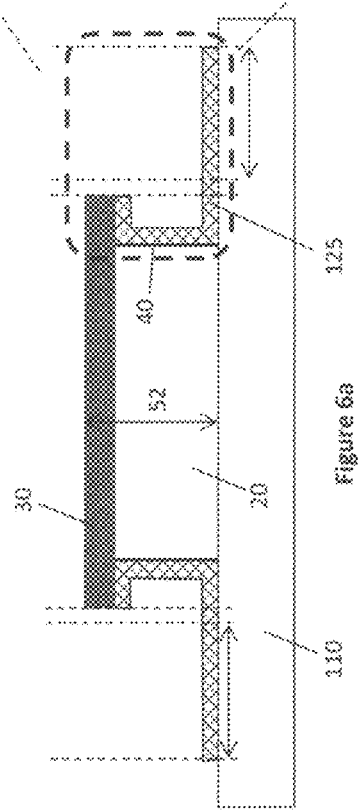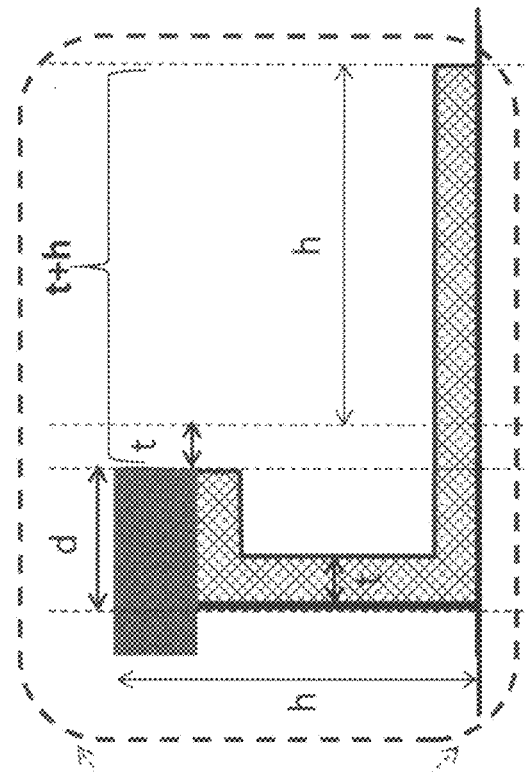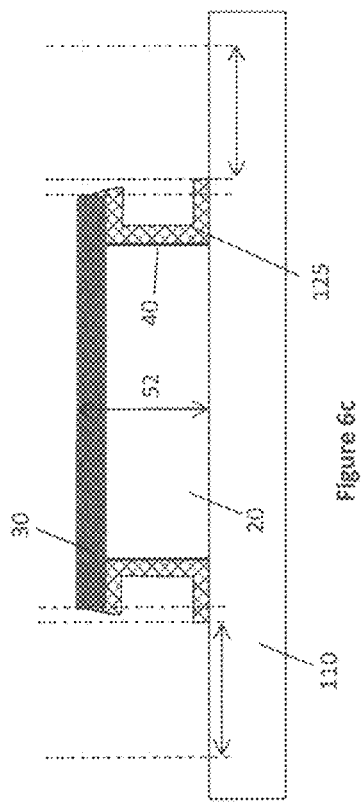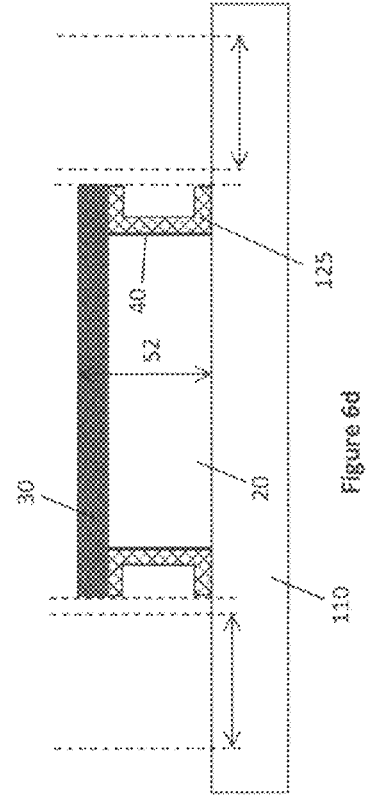

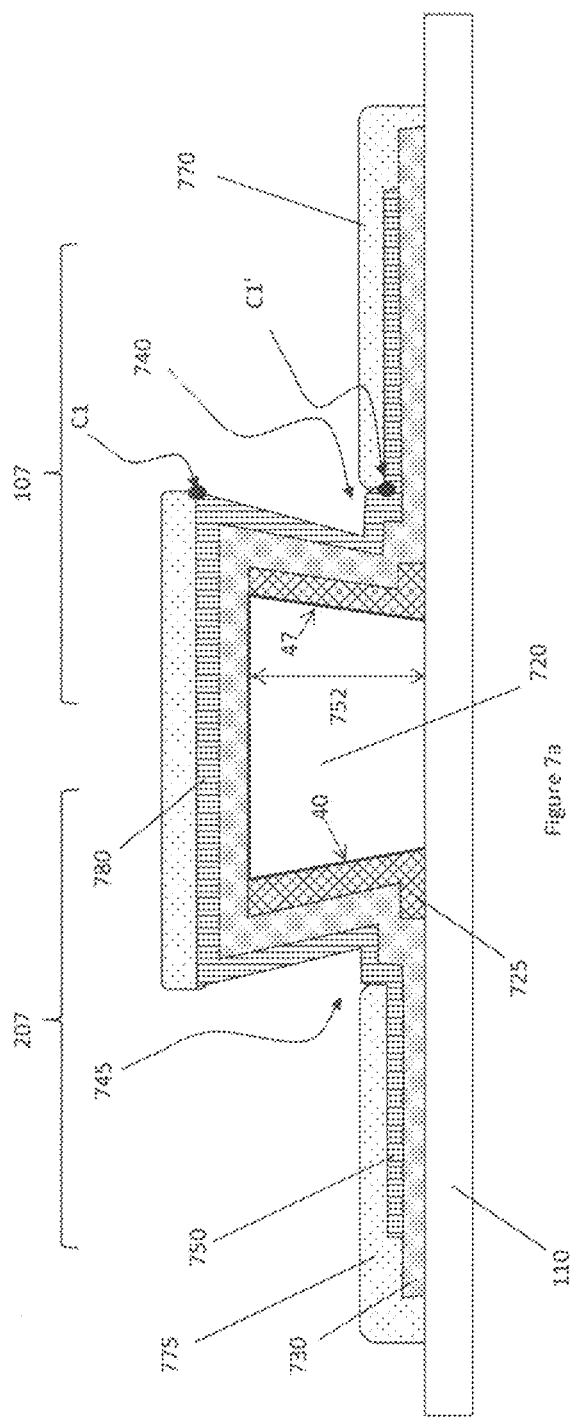
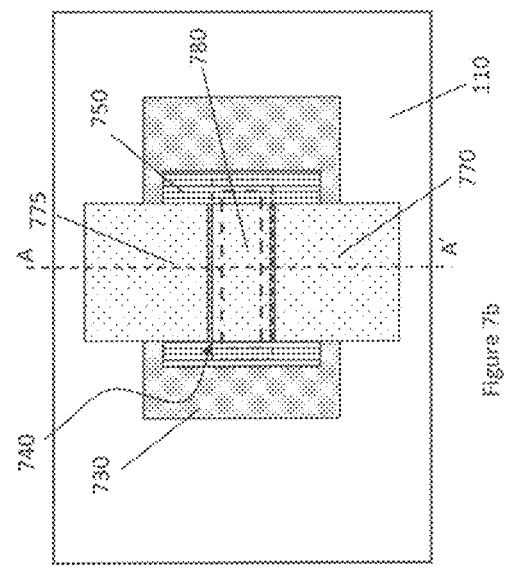

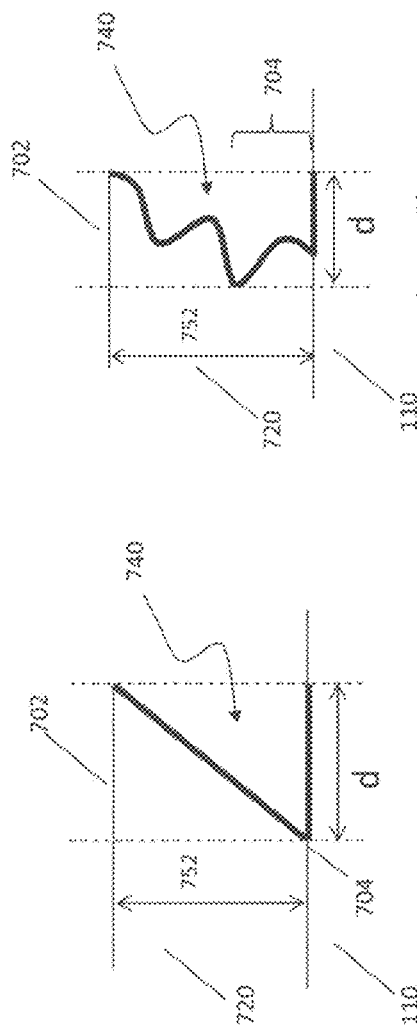
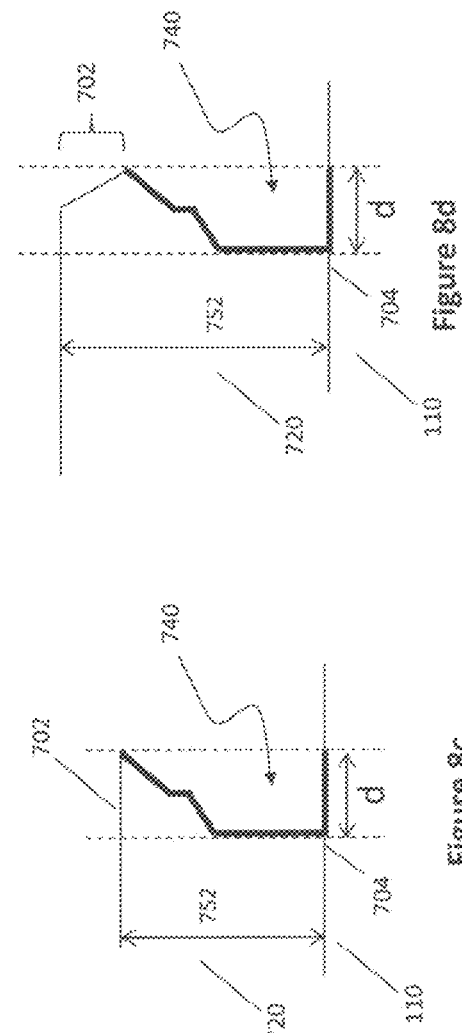
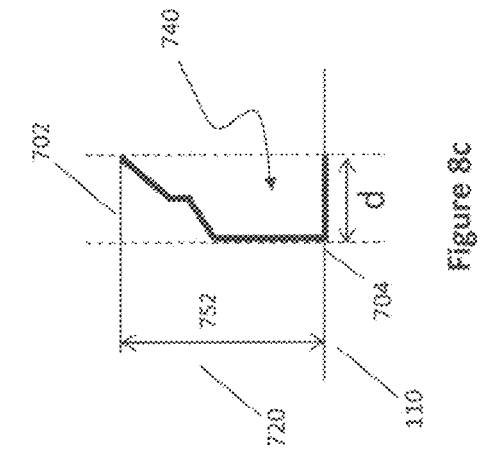
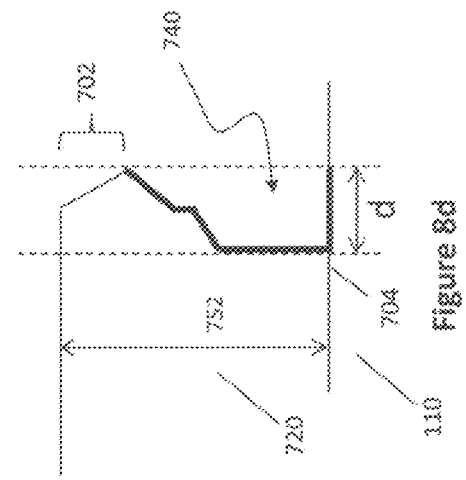
Figure 8a
Figure 8b
Figure 8c
Figure 8d

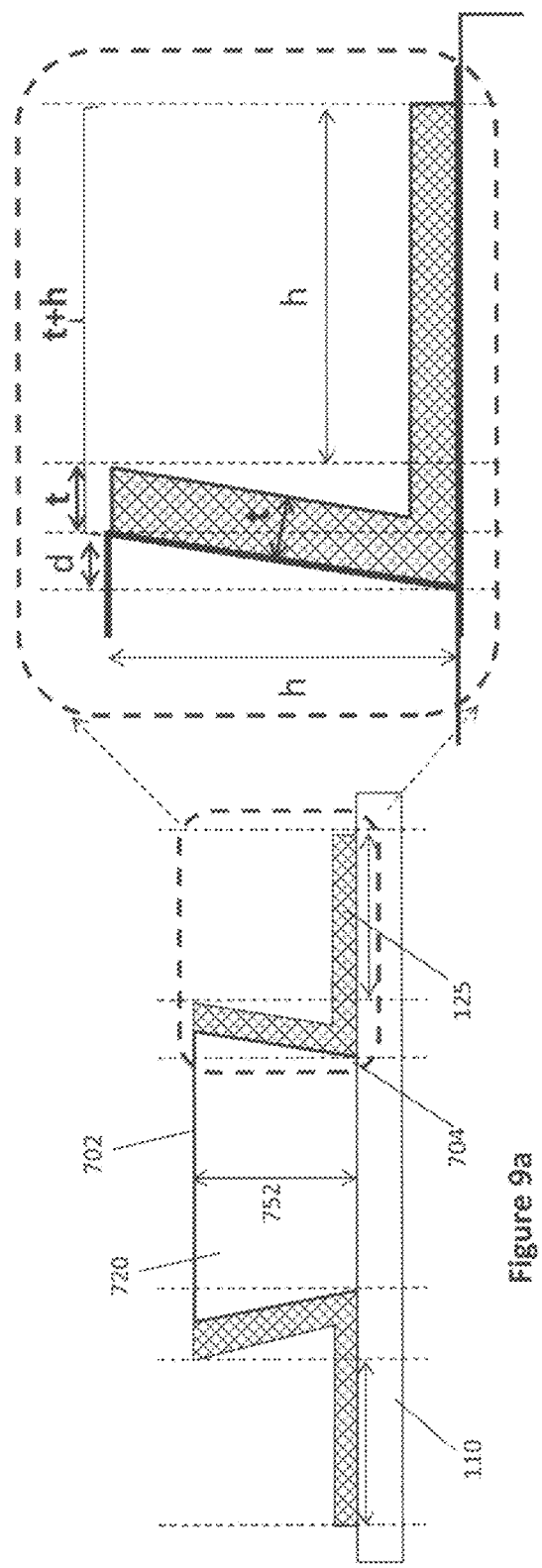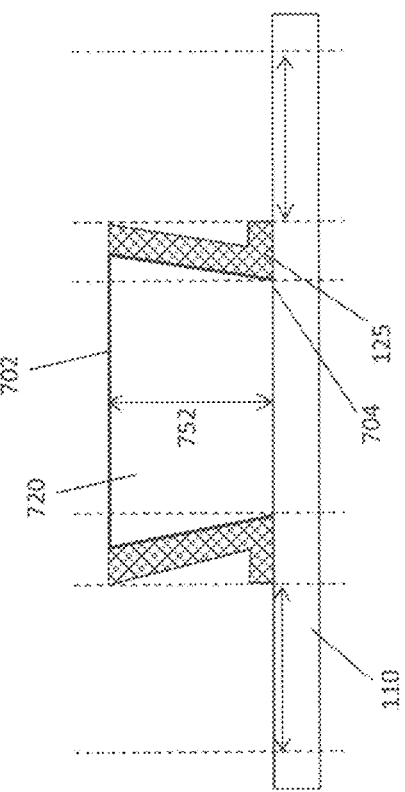

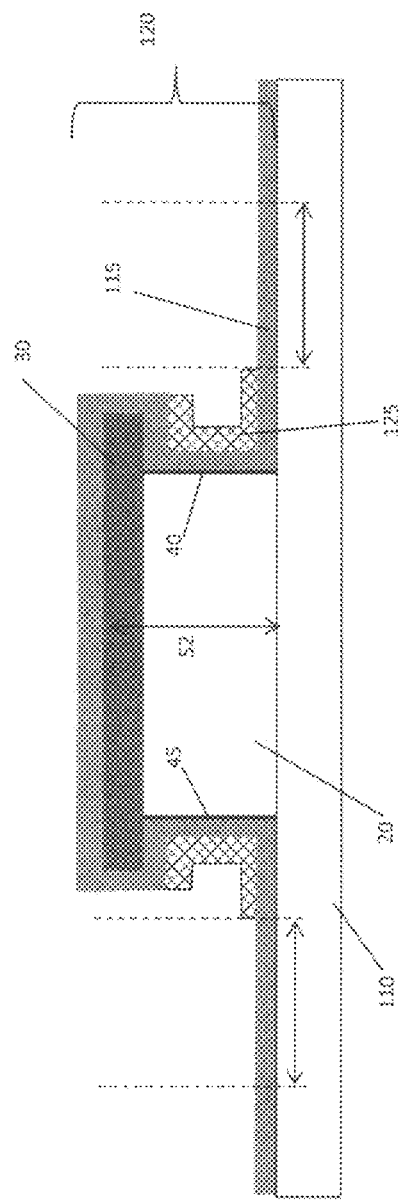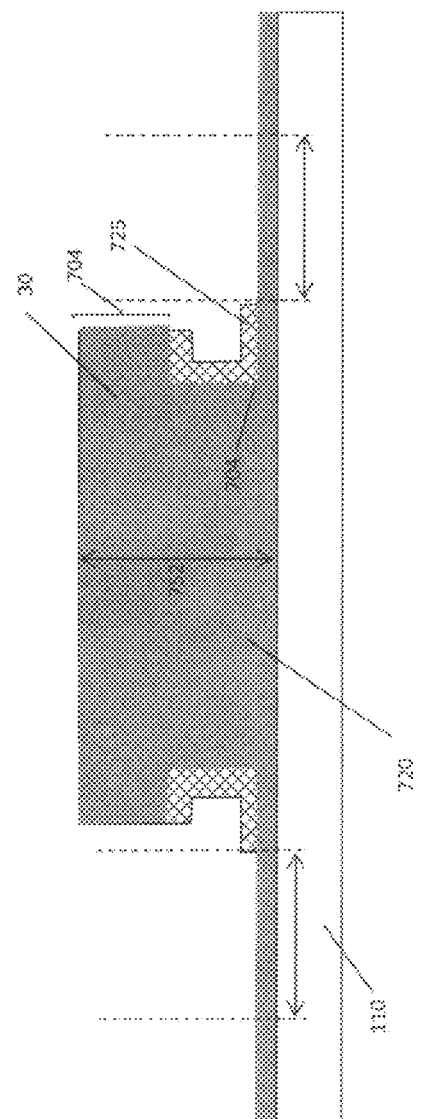

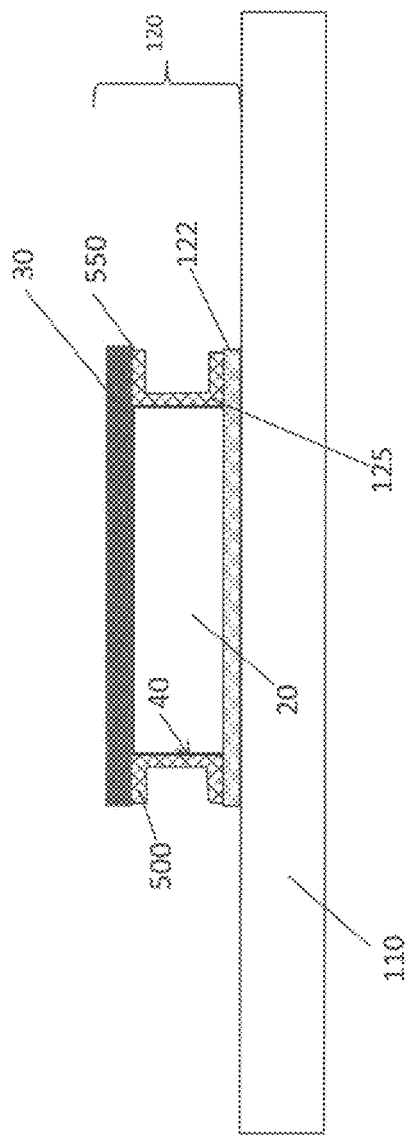
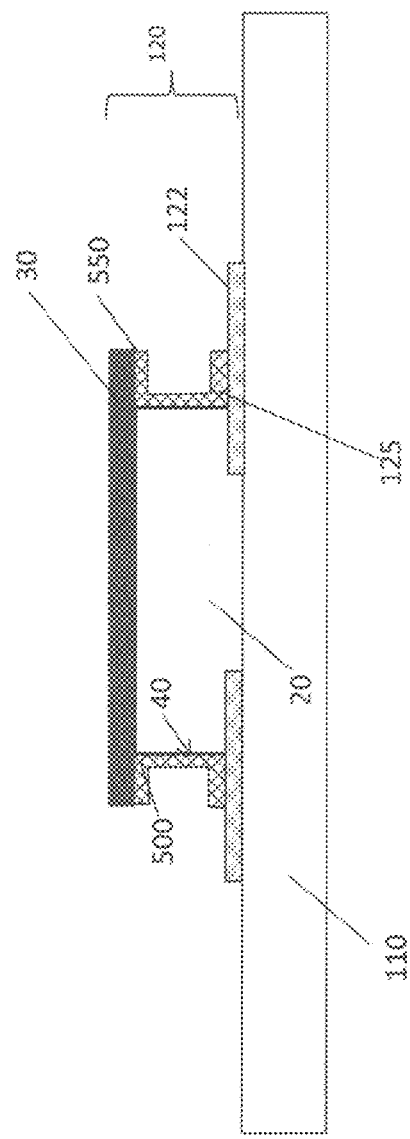

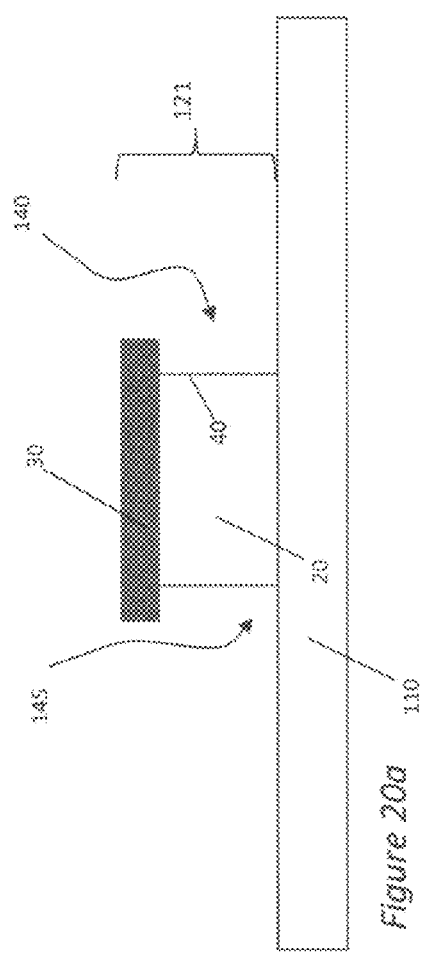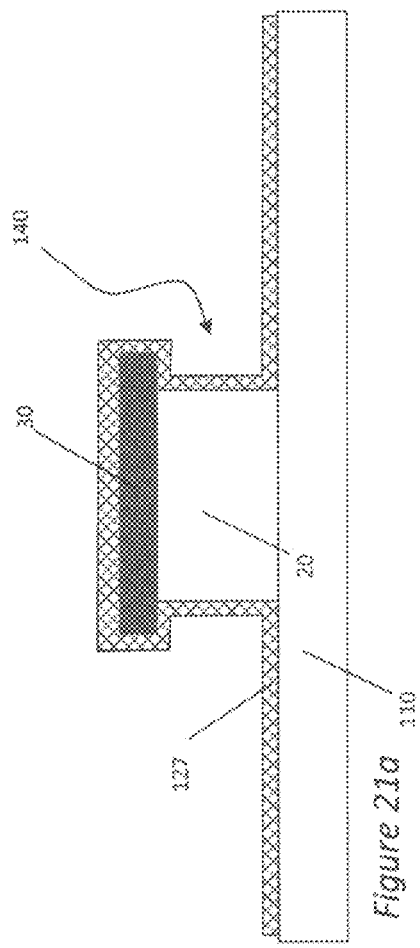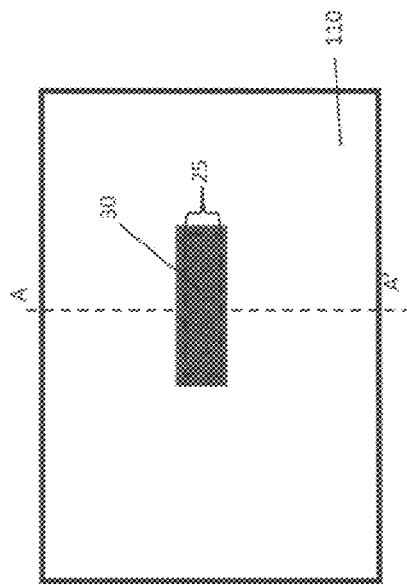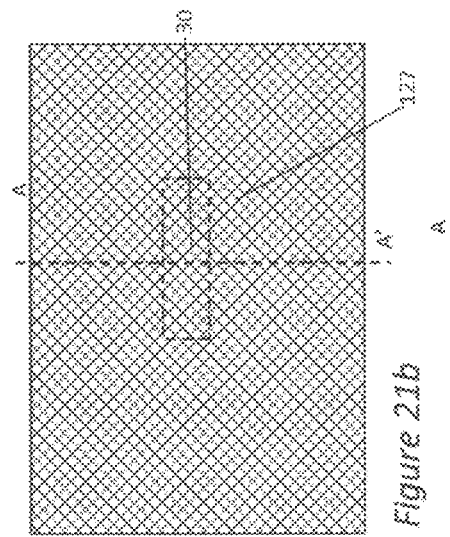

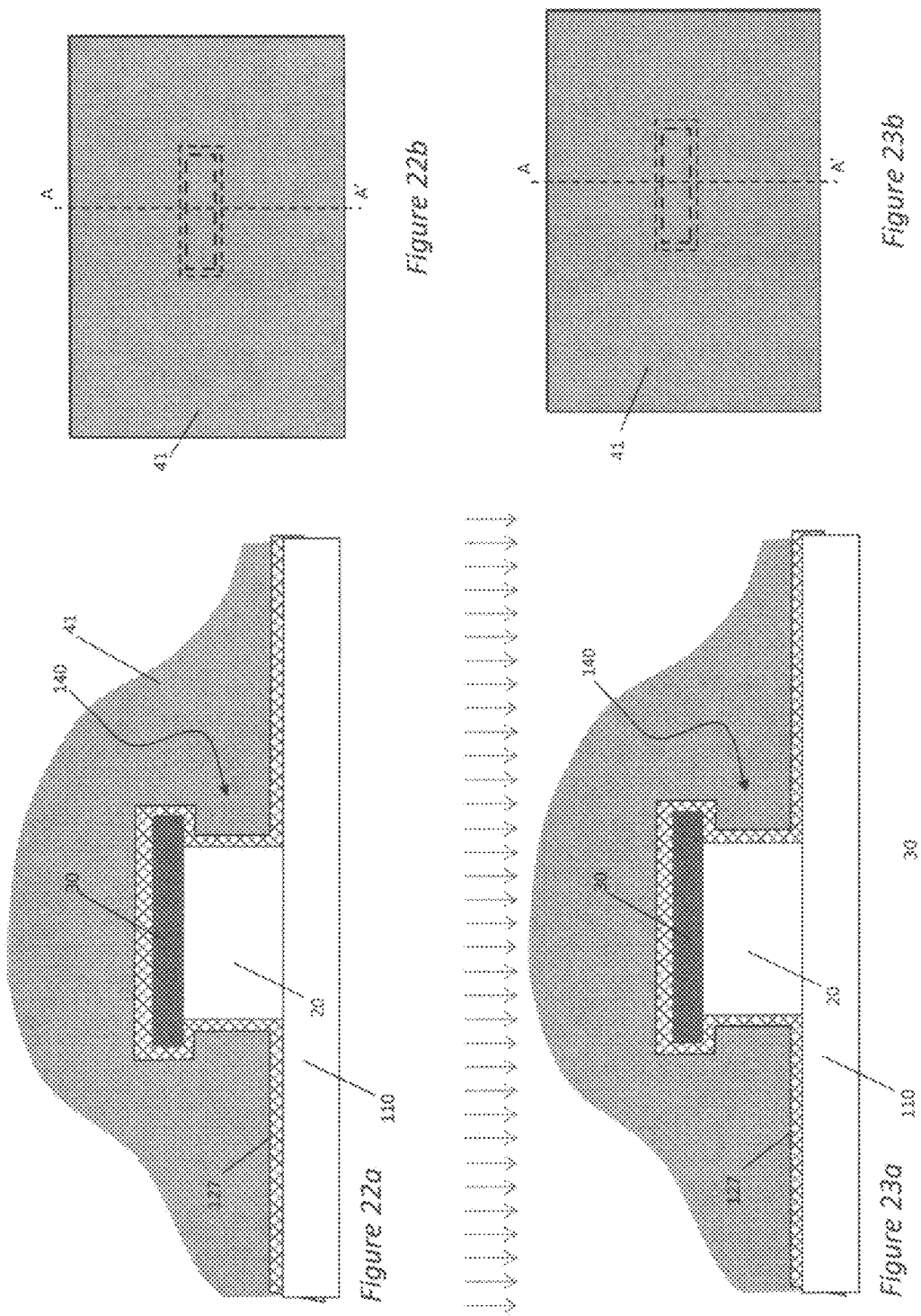

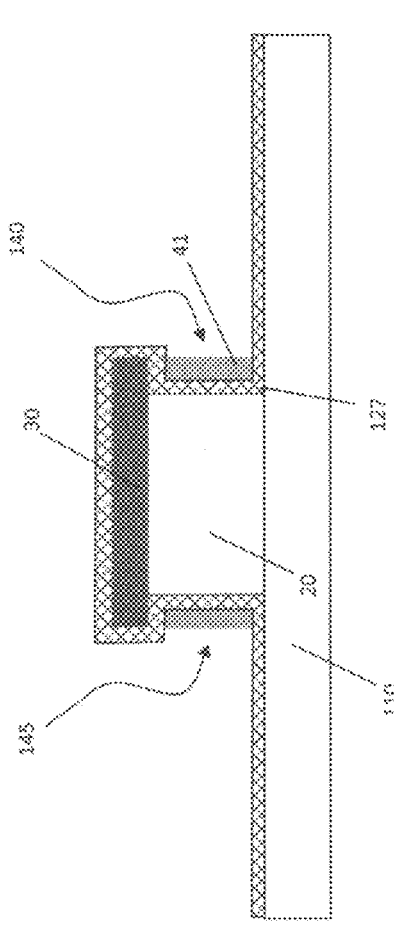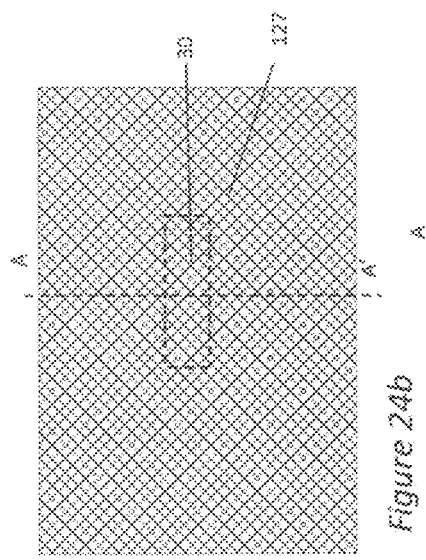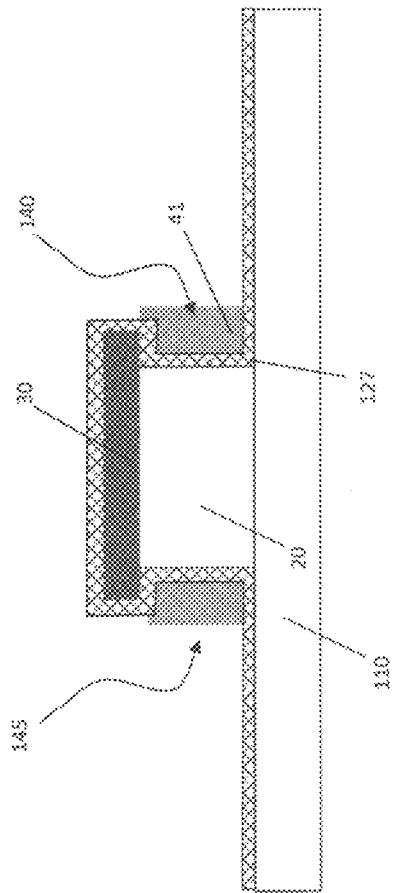
Figure 24a
Figure 24b
Figure 24c

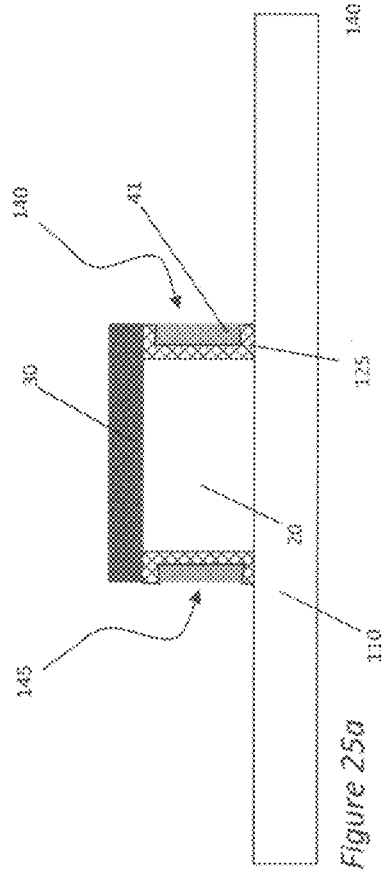
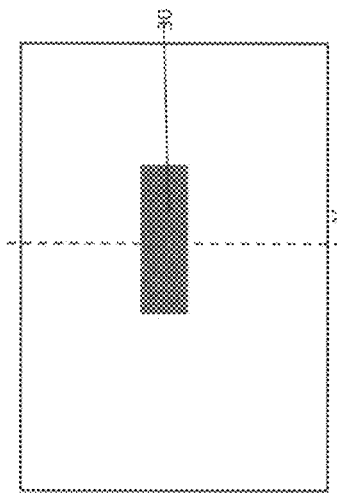
Figure 25a
Figure 25b
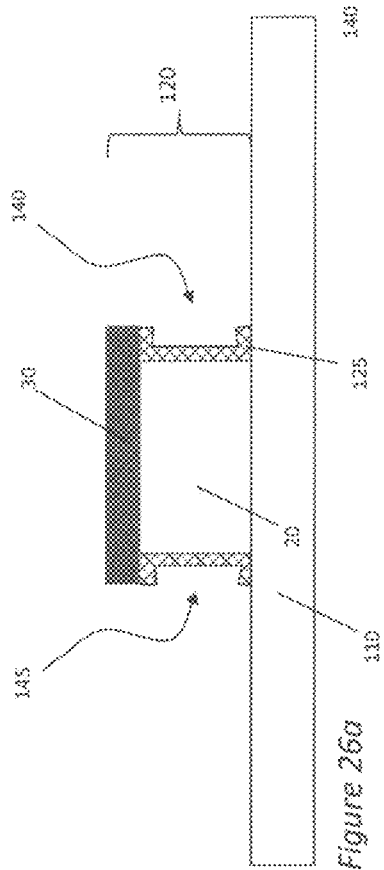
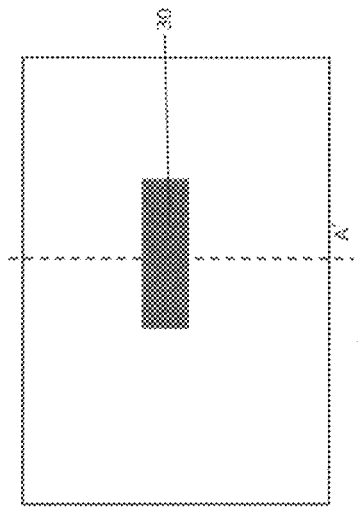
Figure 26a
Figure 26b

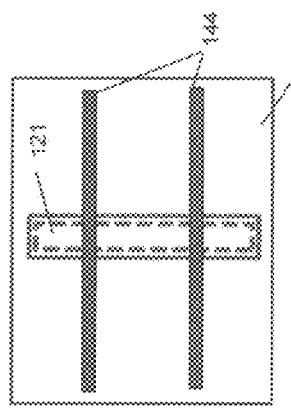
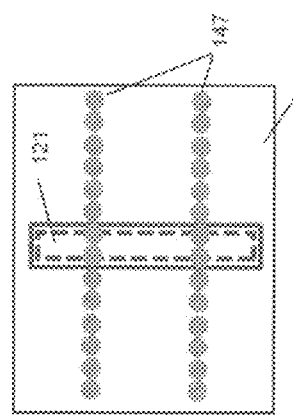
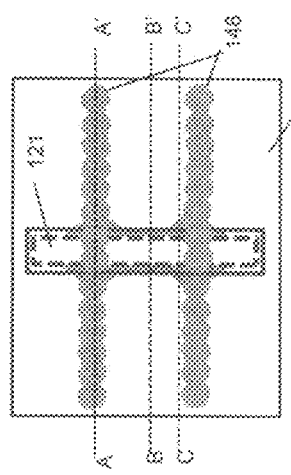
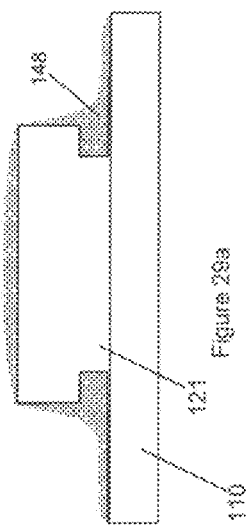
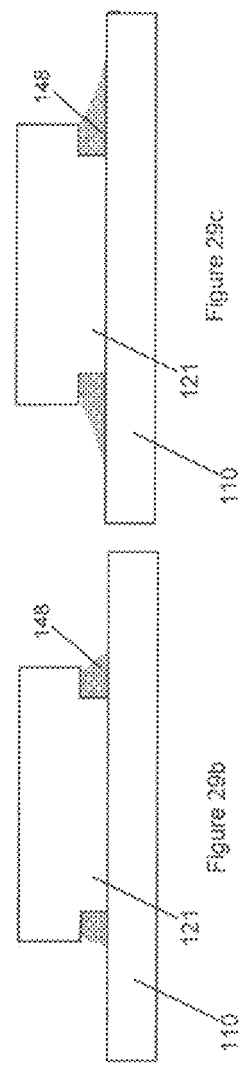

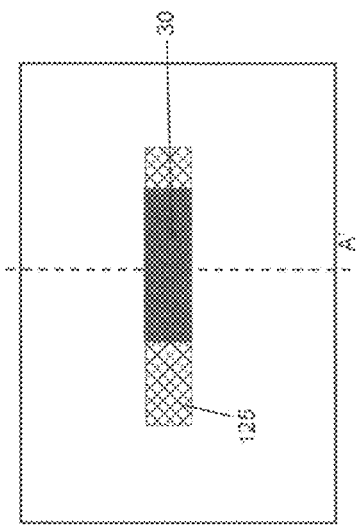
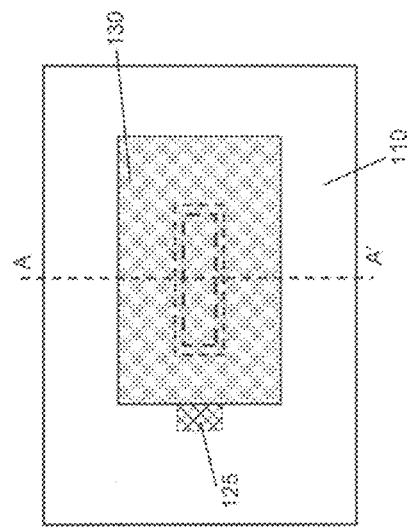
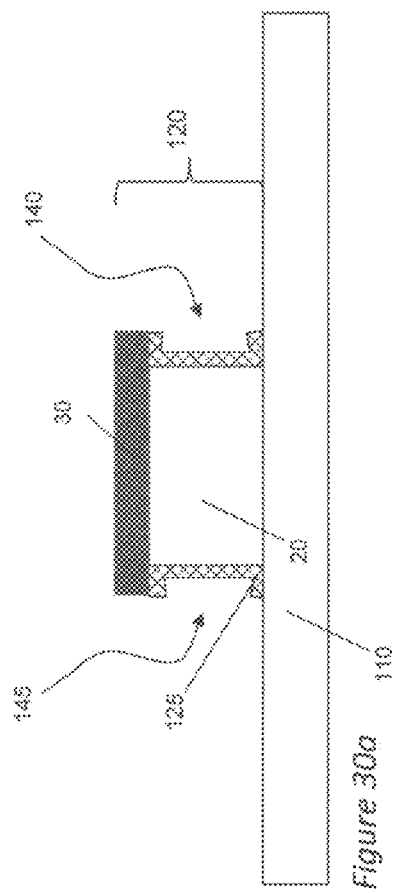
Figure 30a
Figure 30b
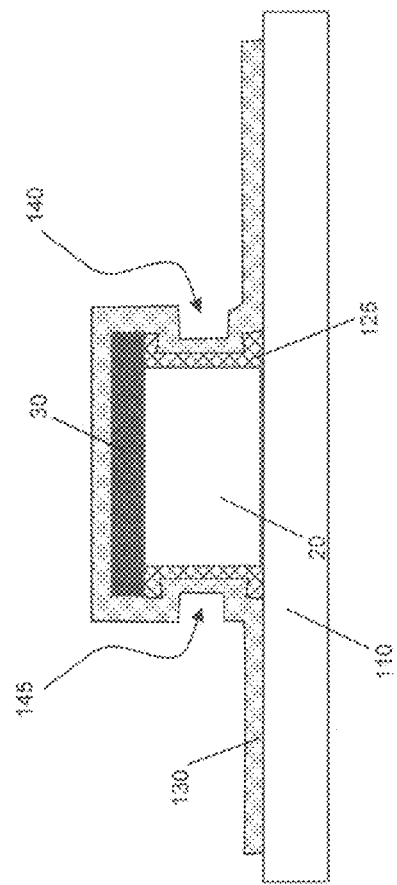
Figure 31a
Figure 31b

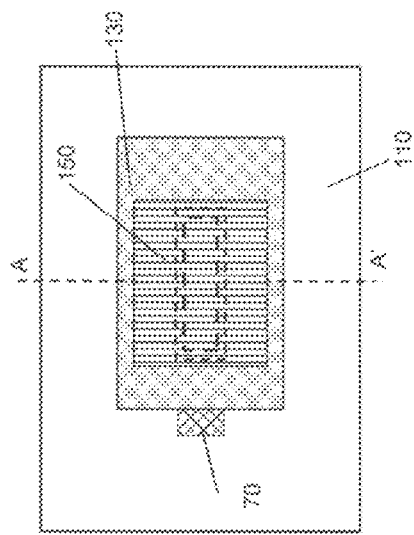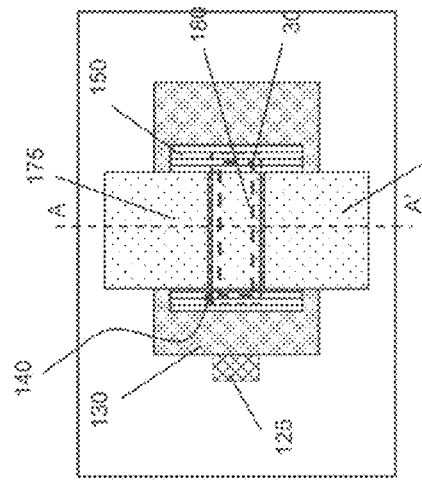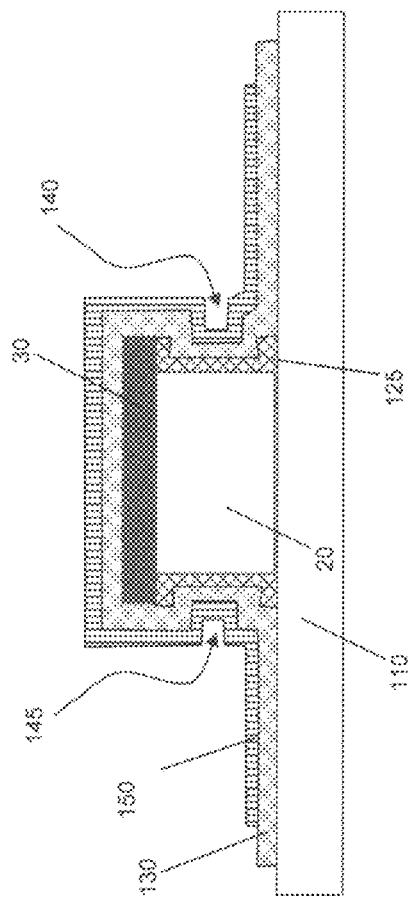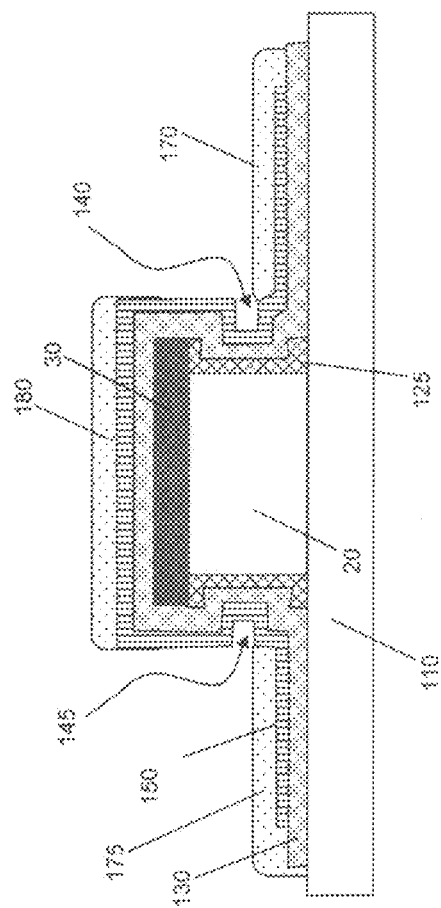
Figure 32a
Figure 32b
Figure 33a
Figure 33b

_US 9,178,029 B2_

FORMING A VTFT GATE USING PRINTING

CROSS REFERENCE TO RELATED APPLICATIONS

Reference is made to commonly-assigned, U.S. patent application Ser. No. 14/198,633, entitled "VTFT WITH POST, CAP AND ALIGNED GATE", Ser. No. 14/198,672, entitled "FORMING A VTFT WITH ALIGNED GATE", Ser. No. 14/198,682, entitled "VTFT WITH GATE ALIGNED TO VERTICAL STRUCTURE", all filed concurrently herewith.

FIELD OF THE INVENTION

This invention relates generally to semiconductor devices and in particular to vertical transistor devices.

BACKGROUND OF THE INVENTION

Modern-day electronics systems require multiple patterned layers of electrically or optically active materials, sometimes over a relatively large substrate. Electronics such as radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These electronic components include capacitors, transistors, and power buses. The usual combination of photolithographic patterning methods and selective etch processes has several shortcomings including high cost, difficulty with large substrates, and complexity of selective etch processes.

The feature size obtainable using traditional processing methods is limited by the resolution of the photolithography tools. Currently, the smallest feature size for large area display backplanes is around 0.5 microns, and requires expensive high end equipment. Feature sizes for large area substrates with less expensive equipment can be much larger. High speed circuit operation requires TFTs with high drive current, and many applications additionally require the drive current be obtained with low voltage operation. It is well known that TFT performance is improved by reducing the channel length. To move beyond the exposure limitation of feature size, vertical transistors of various architectures are currently being studied. In a vertical TFT architecture, the channel is formed perpendicular to the substrate, and therefore the channel length (L) can be controlled by the height of a layer in the transistor.

Recent work in the fabrication of VTFT, while yielding short channel length devices, has used otherwise standard photolithographic techniques with complex semiconductor processes. For example, since it is not currently possible to put patterns directly on walls which are vertical with respect to the substrate surface, vertical wall patterning has been accomplished using a suitable filler material to partially fill in a trench. The filler material acts as a mask for the portions of the wall located underneath while allowing for processing of the walls above the filler material. This has been used, for example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when it is necessary that an oxide be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

In light of the complicated existing processes there is an ongoing need to provide semiconductor device architectures that include patterned vertical or inclined device surfaces. There is also an ongoing need to provide simple manufacturing techniques capable of processing small device features of semiconductor devices without requiring high resolution alignments and small gap printing for vertical TFTs. There is also an ongoing need to provide higher current semiconductor devices by improving the series resistance of the device.

To maintain good device performance when shrinking the size of the channel, it is typical to scale the layer thicknesses with the size of the device. For example, in convention production CMOS with channel lengths of 90 nm and lower often utilize dielectric layer thicknesses of less than 10 nm. While there are many processes to deposit dielectric materials, few result in high quality films at these thicknesses. Atomic layer deposition (ALD) is a process that is both conformal and known to result in high quality thin layers when used with optimized process conditions.

In ALD processes, typically two molecular precursors are introduced into the ALD reactor in separate stages. U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track. A spatially dependent ALD process can be accomplished using one or more of the systems or methods described in more detail in WO 2008/082472 (Cok), U.S. Patent Application Publications 2008/0166880 (Levy), 2009/0130858 (Levy), 2009/0078204 (Kerr et al.), 2009/0051749 (Baker), 2009/0081366 (Kerr et al.), and U.S. Pat. No. 7,413,982 (Levy), U.S. Pat. No. 7,456,429 (Levy), and U.S. Pat. No. 7,789,961 (Nelson et al.), U.S. Pat. No. 7,572,686 (Levy et al.), all of which are hereby incorporated by reference in their entirety.

There remains a need for novel processes to simplify the manufacture of vertical TFTs. There also remains a need for processes which allow for control of the parasitic capacitance in vertical TFTs, and mitigate the potential for ungated regions.

SUMMARY OF THE INVENTION

According to an aspect of the invention, a method of forming a gate layer of a thin film transistor includes providing a substrate including a gate structure having a reentrant profile. A conformal conductive inorganic thin film is deposited over the gate structure. A polymeric resist is printed that wicks along the reentrant profile of the gate structure. The conformal conductive inorganic thin film is etched in areas not protected by the polymeric resist to form a patterned conductive gate layer located in the reentrant profile of the gate structure.

BRIEF DESCRIPTION OF THE DRAWINGS

In the detailed description of the example embodiments of the invention presented below, reference is made to the accompanying drawings, in which:

FIGS. 1a and 1b are a schematic cross-sectional view and a schematic plan view, respectively, of an example embodiment of a vertical transistor of the present invention;

FIG. 2 is a schematic cross-sectional view of another example embodiment of a vertical transistor of the present invention;

FIG. 3 is a schematic cross-sectional view of another example embodiment of a vertical transistor of the present invention;

FIGS. 5a through 5f are schematic example embodiments of reentrant profiles of the present invention formed using a post and cap;

FIGS. 6a through 6d are schematic example embodiments of a conductive gate layer of the present invention;

FIGS. 7a and 7b are a schematic cross-sectional view and a schematic plan view, respectively, of another example embodiment of a vertical transistor of the present invention;

FIGS. 8a through 8d are schematic example embodiments of reentrant profiles of the present invention;

FIGS. 9a through 9c are schematic example embodiments of a conductive gate layer of the present invention formed over a gate structure;

FIG. 10a is a schematic cross sectional view of an example embodiment of a conductive gate structure of the present invention including a conformal dielectric layer deposited before the conductive gate layer;

FIG. 10b is a schematic cross sectional view of the structure shown in FIG. 10a with some elements grouped for clarity;

FIGS. 11 through 13 are schematic cross sectional views of example embodiments of a conductive gate structure of the present invention including an additional conductive layer;

FIGS. 18a and 18b through FIGS. 26a and 26b are schematic cross-sectional views and plan views, respectively, describing an example embodiment of a process of forming an electrically conductive gate structure of the present invention;

FIGS. 27a-c through FIGS. 29a-c are schematic views of an example embodiment of forming an electrically conductive gate structure of the present invention using wicking with FIGS. 27c, 29a, 29b, and 29c being cross-sectional views and FIGS. 27a, 27b, 28a, 28b, and 28c being plan views;

FIGS. 30a and 30b through FIGS. 33a and 33b are schematic cross-sectional views and plan views, respectively, of a process of using the electrically conductive gate structures of the present invention to form vertical transistors of the present invention;

DETAILED DESCRIPTION OF THE INVENTION

Figure 4:
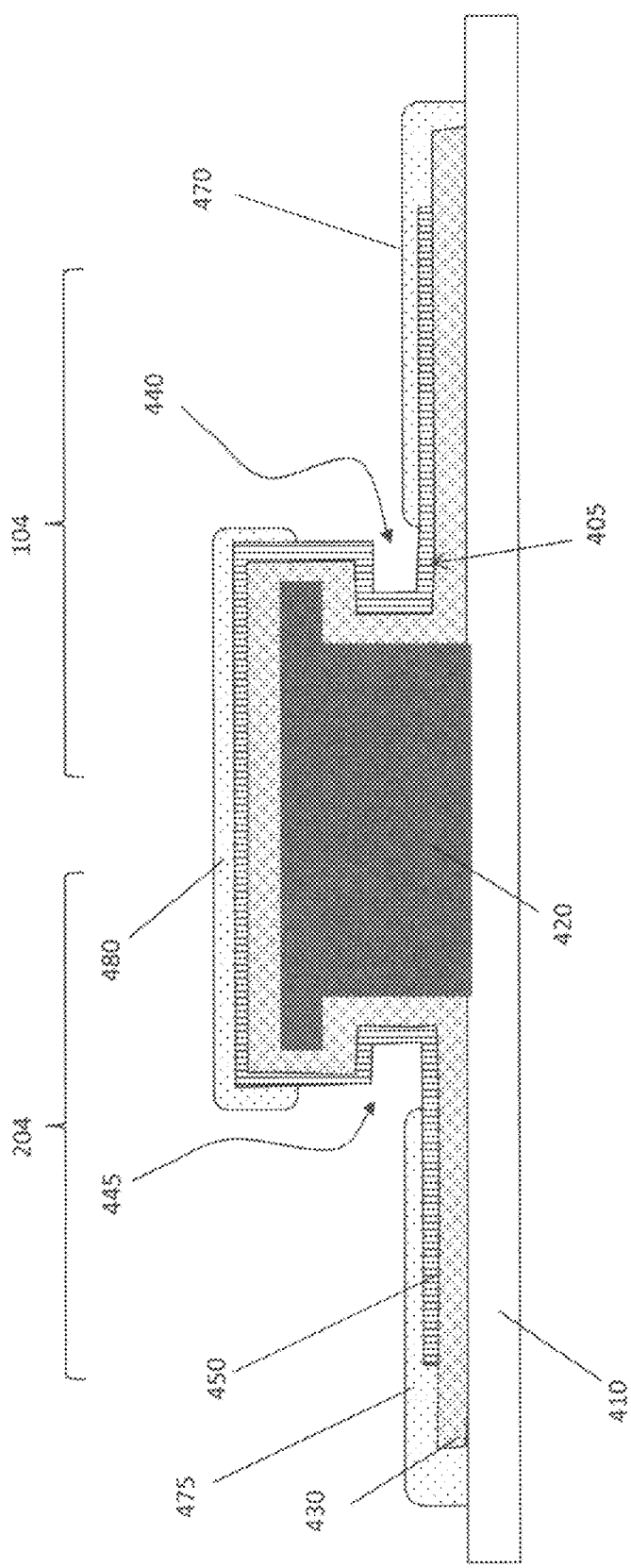
FIG. 4 is a schematic cross-sectional view of a prior art vertical transistor.

For the description that follows, the term "gas" or "gaseous material" is used in a broad sense to encompass any of a range of vaporized or gaseous elements, compounds, or materials. Other terms used herein, such as "reactant," "precursor," "vacuum," or "inert gas," for example, have their conventional meanings as would be well understood by those skilled in the materials deposition art. The term "over" refers to the relative position of an element to another and is insensitive to orientation, such that if one element is over another, it is still functionally over if the entire stack is flipped upside down. As such, the terms "over," "under," or "on" are functionally equivalent and do not require the elements to be in contact, and do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

The embodiments of the present invention relate to short channel vertical thin film transistors (TFTs) which contain a post to define the vertical portion of the channel. The term vertical transistor, as used herein, refers to transistors where the source and drain which define a single channel are at two different distances from the substrate surface (as measured orthogonal to the substrate). This arrangement results in vertical transistors where at least a portion of the channel is vertically oriented with respect to the substrate, which is to say not parallel to the top surface of the substrate. Vertical transistors of the present invention include those that have portions of their channels in an arrangement that is parallel to the substrate surface, as long as they have a portion which is not parallel.

Vertical transistors of the present invention are formed using a gate structure. As used herein, the gate structure can be any structure which has a reentrant profile. The gate structure can be uniform in material composition, or be formed of multiple materials. The gate structure can also be referred to as a post, as long as the post has a reentrant profile. The gate structure can be formed using a post and cap, where the cap extends beyond the wall of the post to define a reentrant profile. The gate structure can be formed from any material, including both conductive and insulating materials. The electrically conductive gate structure, as used herein, refers to the structure which contains the conductive material which is used to gate the vertical transistor channel. In some example embodiments, the electrically conductive gate structure includes a gate structure and an electrically conductive gate layer.

The phrase "structural polymer," as used herein, refers to a polymeric material used in the formation of the polymer post and is useful to distinguish the structural polymer material from other polymeric materials or polymer layers that can be used in the process. The structural polymer is a polymer that is stable in the final application. A wide variety of structural polymers can be used including, for example, polyesters, polyetheresters, polyamides, polyesteramides, polyurethanes, polyimides, polyetherimides, polyureas, polyamide-imides, polyphenyleneoxides, phenoxy resins, epoxy resins, polyolefins, polyacrylates, polyethylene-co-vinyl alcohols (EVOH), and the like, or their combinations and blends. The preferred structural polymers are epoxy resins and polyimides. The structural polymer can be a thermoplastic polymer. The polymer can be a curable composition, for example, a thermal or a radiation curable composition. Although the polymer does not need to be radiation curable or photosensitive, photosensitive formulations are useful in the present invention so long as the final cured polymer layer has the structural and mechanical properties required in the final application. Polyimide is a preferred structural polymer due to the combination of film properties such as low stress, low CTE, low moisture uptake, high modulus and good ductility for microelectronic applications. Epoxy resins are also preferred due to their thermal and chemical properties. A radiation curable composition including a highly branched, multifunctional epoxy bisphenol A-novolac resins, such as Epon SU-8 from Momentive Specialty Chemicals Inc., is one example of a useful epoxy resin.

The process of making the vertical thin film transistors of the present invention can be carried out below a support temperature of about 300° C., more preferably below 250° C., or even at temperatures around room temperature (about 25° C. to 70° C.). These temperatures are well below traditional integrated circuit and semiconductor processing temperatures, which enable the use of any of a variety of relatively inexpensive supports, such as flexible polymeric supports. Thus, the invention enables production of relatively inexpensive devices on flexible substrates without the need for photolithography and enabling rapid pattern changes due to printing the patterns.

The substrates used in the present invention can be any material that acts as a mechanical support for the subsequently coated layers. The substrate can include a rigid material such as glass, silicon, or metals. Particularly useful metals are stainless steel, steel, aluminum, nickel, or molybdenum. The substrate can also include a flexible material such as a polymer film or paper such as Teslin. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly (ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), or fiber-reinforced plastics (FRP). The thickness of substrate 110, described below, can vary, typically from about 100 µm to about 1 cm.

A flexible support or substrate can be used in the present invention. Using a flexible substrate allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils, such as stainless steel, provided the foils are coated with an electrically insulating material layer to electrically isolate any electric components such as thin film transistors. Nominally rigid materials that are flexible due to their thinness may also be used. These include glass at thicknesses below 200 µm and metals at thicknesses below 500 µm.

In some example embodiments, the substrate can include a temporary support or support material layer, for example, when additional structural support is desired for a temporary purpose, e.g., manufacturing, transport, testing, or storage. In these example embodiments, substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other than the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, or chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

In the present invention, the formation of the patterned structural polymer layers can be accomplished using patterned thin film inorganic materials. The patterning of the thin film inorganic material on top of the structured polymer layer can be done using standard photolithographic techniques or through the use selective area deposition (SAD) in combination with atomic layer deposition (ALD) to form a patterned thin film inorganic material layer on top of the structural polymer layer. SAD employs a patterned material referred to as a "deposition inhibitor material", "deposition inhibiting material", or simply an "inhibitor" that inhibits the growth of a thin film material on the substrate when the substrate is subjected to an atomic layer deposition. Because the growth where the deposition inhibitor material is present is inhibited, the ALD process only deposits material in regions (selective areas) of the substrate where the inhibitor is not present. The phrases "deposition inhibitor material", "inhibitor material" and their equivalents refer herein to any material on the substrate that inhibits the deposition of material during atomic layer deposition (ALD). The "deposition inhibitor material" includes the material applied to the substrate as well as the material resulting from any optionally subsequent crosslinking or other reaction that modifies the material that can occur prior to depositing an inorganic thin film on the substrate by atomic layer deposition. A polymeric deposition inhibitor material can be crosslinked after applying the polymer onto the substrate, before or during the pattering step.

The vertical thin film transistors of the present invention are composed of dielectric, semiconductor, and conductor materials. In preferred embodiments of the present invention the dielectric, semiconductor, and conductor materials are inorganic thin films. A dielectric material (also called an insulator material) is any material that is a poor conductor of electricity. Such materials typically exhibit a bulk resistivity greater than 1010 Ω-cm. Examples of dielectrics are SiO2, HfO, ZrO, SiNx, or aluminum oxide. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, or gallium arsenide. Particularly preferred semiconductors are zinc oxide, indium zinc oxide, or gallium indium zinc oxide. The semiconductors may be doped to render them n-type or p-type, or to modulated the number of charge carriers present. Conductors of the present invention include metals, such as Al, Ag, Au, Cr, Mo, or In and inorganic conducting oxides, such as indium doped tin oxide (ITO) or aluminum doped zinc oxide (AZO).

The dielectric and semiconductor inorganic materials layers are conformal, and are preferably deposited using an atomic layer deposition process (ALD). ALD is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed is removed from the vacuum chamber. A second precursor is then applied to react with the first precursor on the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, U.S. Pat. No. 7,789,961, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The preferred process of the present invention employs a continuous spatially dependent ALD (as opposed to pulsed or time dependent ALD.) The process of the present invention allows operation at atmospheric or near-atmospheric pressures and is capable of operating in an unsealed or open-air environment. The process of the present invention is adapted such that material can be deposited only in selected areas of a substrate.

Atomic layer deposition can be used in the present invention to deposit a variety of inorganic thin films that are metals or that comprise a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium, or indium, or combinations thereof.

Oxides that can be made using the process of the present invention include, but are not limited to: zinc oxide (ZnO), aluminum oxide, hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, MgxZn1-xO, or LiZnO.

Metals that can be made using the process of the present invention include, but are not limited to, copper, tungsten, aluminum, nickel, ruthenium, or rhodium. It will be apparent to the skilled artisan that alloys of two, three, or more metals may be deposited, compounds may be deposited with two, three, or more constituents, and such things as graded films and nano-laminates may be produced as well.

Turning now to the figures, a schematic cross-sectional view of vertical transistors 100 and 200 of the present invention is shown FIG. 1a, taken along the line A-A' of the plan view shown in FIG. 1b. For simplicity, the following description will focus on vertical transistor 100 with the understanding that the descriptions apply equally to vertical transistor 200.

Vertical transistor 100 includes a substrate 110. Substrate 110, often referred to as a support, can be rigid or flexible and should be understood from the previous description. A post 20 is on substrate 110. Post 20 has a height dimension 50 extending away from the substrate 110 to a top defined by a length dimension and a width dimension 25 over the substrate, and an edge 40 along the height dimension 50. A cap 30 is on top of the post 20. The cap 30 covers the top of the post 20 in the width dimension 25 of the post, the cap 30 extending beyond at least one edge 40 of the post 20 to define a reentrant profile 140. As shown, reentrant profile 140 includes an underside of the cap, an edge of the post, and a portion of the substrate over which the cap extends. The post 20 and cap 30 have a combined height 52.

The post 20 can be formed of any material that has a sufficient height 50. The post 20 can be a conductive material such as a metal, or an insulating material such as a structural polymer. The cap 30 can be any material which can be formed to extend beyond post 20. The cap 30 can be a conductive material or an insulating material; and can be an inorganic or organic material. In some example embodiments, the cap 30 and post 20 are the same material. In some embodiments the cap 30 and post 20 are formed simultaneously. In a preferred embodiment the cap 30 is an inorganic material and post 20 is a structural polymer, preferably an epoxy resin or polyimide. In another preferred embodiment the cap 30 is an inorganic material and post 20 is a thick inorganic conductive material, preferably a metal post. The post 20 and cap 30 form a gate structure 121.

A conformal conductive material forms the gate layer 125 on at least the edge 40 of the post 20, within the reentrant profile 140. As shown, the gate layer 125 can also have a portion on the underside of the cap 30, and has a portion that extends along the substrate 110 under the cap 30 not over the post 20. The gate layer 125 is not over the cap. As shown in FIG. 1a, the gate layer 125 can be fully contained within the reentrant profile 140. The conformal conductive gate layer 125 can be a single layer of material, or a multilayer stack. Gate layer 125 can also be a metal, an inorganic conductive oxide or a combination. The post 20, cap 30 and conductive gate layer 125 form an electrically conductive gate structure 120 having a first reentrant profile 140.

As shown in FIG. 1a, TFT 100 is a vertical transistor structure, where the vertical portion is defined by the post 20 with the cap 30, where the conductive gate layer 125 is in contact with the edge 40 of the post 20, an insulating layer 130 is in contact with the gate layer 125, semiconductor layer 150 is in contact with insulating layer 130, and a first portion of semiconductor layer 150 is in contact with the first electrode 180, while a second portion of semiconductor layer 150 is in contact with second electrode 170, not located over the post.

Turning now to TFT 200 shown in FIG. 1a, cap 30 can extend over another edge 45 of the post 20, where edge 45 is opposite edge 40, to form a second reentrant profile 145. As such, the post has another edge along the height dimension, and the cap extends beyond the other edge of the post to define a second reentrant profile. As shown, a third electrode 175 is located in contact with a third portion of the semiconductor layer 150 over the substrate 110 and not over the post 20, and adjacent to the other edge 45 in the second reentrant profile 145. TFT 200 is another vertical transistor structure, where the vertical portion is defined by the post 20 with the cap 30, where the conductive gate layer 125 is in contact with the edge 45 of the post 20, an insulating layer 130 is in contact with the gate layer 125, semiconductor layer 150 is in contact with insulating layer 130, and a first portion of semiconductor layer 150 is in contact with the first electrode 180, while a second portion of semiconductor layer 150 is in contact with third electrode 175, not located over the post. Vertical transistor 200 can be formed simultaneously and by the same process steps as vertical transistor 100. As shown in FIGS. 1a and 1b, vertical transistor 100 and vertical transistor 200, can be connected in series by electrode 180 and are formed over an electrically conductive gate structure 120.

As shown, the conformal gate layer 125 is not on the top surface of the cap 30. Additionally, the gate layer 125 extends on the substrate 110 beyond base of the post 20. These two features solve issues found with VTFTs of the prior art. Turning briefly to FIG. 4, a cross section of prior art VTFTs 204 and 104 is shown. Vertical transistor 104 includes a substrate 410, a conductive gate structure 420 having a reentrant profile 440. VTFT 104 includes a conformal dielectric layer 430, a semiconductor layer 450 and electrodes 470, 475 and 480. As shown, the prior art conductive gate structure 420, is fully conductive over the entire surface of the structure. In the prior art structure shown, there is an ungated region 405 between the base conductive gate structure 420 and the first electrode 470. This ungated region causes difficulty in device operation, and can be controlled, minimized, or eliminated by using the gate structures of the present invention. Additionally, the prior art conductive gate structure 420 has a conductive top, which causes unwanted (parasitic) capacitance between the gate structure 420 and electrode 480. It is desired to use the conductive gate structure 120 of the present invention (as shown in FIG. 1a, for example) which avoids these issues of the ungated region and unwanted capacitance, and is additionally manufacturable.

Returning now to FIGS. 1a and 1b, the portion of the gate layer 125 which gates the semiconductor channel of transistor 100 is only located within the reentrant profile 140. However, the gate layer 125 can optionally extend beyond the post 20 and cap 30 in a region separate from the semiconductor channel for ease in electrical circuit formation. Preferably, the extension from the post 20 and cap 30 is along the length direction of post 20, and can be seen in FIG. 1b as portion 70 of gate layer 125.

Continuing with FIGS. 1a and 1b, insulating layer 130 conforms to the reentrant profiles 140 and 145 of transistors 100 and 200. Insulating layer 130 can be said to coat and maintain the reentrant profiles 140 and 145, and is in contact with the gate layer 125. Insulating layer 130 is a conformal insulating material layer. Insulating layer 130 is often referred to as a dielectric material layer, or simply a dielectric layer, and can be formed of a single material layer or multiple dielectric material layers. Preferably, the insulating layer 130 is a thin film inorganic dielectric material layer. Semiconductor layer 150 also conforms to the first reentrant profile 140 and second reentrant profile 145 of transistors 100 and 200 and maintains the shape, and is in contact with the insulating layer 130. Semiconductor layer 150 is a conformal semiconductor material layer. Preferably, the semiconductor layer 150 is a thin film inorganic semiconductor material layer.

The source and drain have conventionally accepted meanings, and either the first electrode 180 or the second electrode 170 can be designated the source (or drain) as is required by the application or circuit. The first electrode 180, second electrode 170 and third electrode 175 can each be a single conductive material, as shown in FIG. 1a, or may each comprise any number of conductive material layers. The first electrode 180 is located in contact with a first portion of the semiconductor layer over the cap. The second electrode 170 electrode is located in contact with a second portion of the semiconductor layer over the substrate and not over the post, as shown in FIG. 1a. The first electrode 180 and second electrode 170 electrode define a first channel in the semiconductor layer between the first electrode 180 and second electrode 170. The first electrode 180 has an edge into the plane of FIG. 1a along the line defined by point C1. As shown in FIG. 1a, point C1 is above the substrate surface. Similarly, the second electrode 170 has an edge into the plane of FIG. 1a along the line defined by point C1'. As shown in FIG. 1a, the first electrode 180 and second electrode 170 electrodes are different distances from the substrate surface (see points C1 and C1'). Stated another way, the distance between the first electrode 180 and second electrode 170 is greater than zero when measured orthogonal to the substrate surface. This forms the first vertical transistor 100, which has a portion of the channel which is vertical with respect to the substrate 110 surface.

As shown in FIG. 1a, the vertical TFT 100 is formed in series with vertical TFT 200. In this configuration, there are three electrodes, a second electrode 170 for TFT 100 not over the post 20, the shared first electrode 180 over the cap 30 and post 20, and a third electrode 175 for TFT 200 not over the post 20 on the opposite side of post 20 from the second electrode 170 electrode of TFT 100. As such, the first electrode 180 and the second electrode 170 define the channel of the first TFT 100, and the third electrode 175 and the first electrode 180 define the channel of the second TFT 200.

As shown, when the post 20 and cap 30 are conductive materials, they connect the portions of the gate layer 125, and the combined electrically conductive gate structure 120 functions as the gate for transistors 100 and 200. Alternatively, when the post 20 and cap 30 are insulating the electrically conductive gate structure 120 can still function as the gate for both transistors 100 and 200 when the portions of the gate layer are connected using some other means. In some example embodiments of transistor 100, electrode 170 functions as the drain of transistor 100 and electrode 180 functions as the source of transistor 100. In other example embodiments of transistor 100, electrode 170 functions as the source and electrode 180 functions as the drain. The semiconductor device is actuated in the following manner. After transistor 100 is provided, a voltage is applied between the electrode 170 and the electrode 180. A voltage is also applied to the electrically conductive gate structure 120 to electrically connect the electrode 170 and the electrode 180.

Still referring to FIGS. 1a and 1b, vertical transistor 200 is formed at the same time as vertical transistor 100. Transistor 200 can be actuated in the following manner. A voltage is applied between the electrode 175 and the electrode 170, which is shared with vertical transistor 100. A voltage is applied to the electrically conductive gate structure 120, which is shared with vertical transistor 100, to electrically connect the electrode 175 and 170.

Alternatively, transistor 100 and transistor 200 can be actuated in series by applying a voltage between electrode 170 and electrode 175. A voltage is applied to the electrically conductive gate structure 120, which simultaneously electrically connects electrode 180 to electrode 170 and connects electrode 180 to electrode 175. This can be advantageous for circuit applications because external electrical connections do not need to be made to the elevated third electrode 180.

In other embodiments, the electrically conductive gate structure 120 can independently gate transistor 100 and 200; in these embodiments the portion of the gate layer 125 in reentrant profile 140 is not connected to the portion of the gate layer 125 in reentrant profile 145, and the post 20 and cap 30 are insulating.

The reentrant profile 140 of transistor 100 allows a dimension of the semiconductor material channel of the transistor to be associated with the height of the electrically conductive gate structure 120, which is defined by the height of the post 20, of transistor 100. Advantageously, this architecture reduces reliance on high resolution or very fine alignment features during the manufacture of transistors that include short channels. Furthermore, the separation of the first electrode 180 and second electrode 170 is primarily determined by the reentrant profile 140 in the gate layer stack. Additionally, the first electrode 180, second electrode 170 and the third electrode 175 are formed simultaneously and have the same material composition and layer thickness.

As shown, the second electrode 170 is located adjacent to the edge 40 of the post 20 in the first reentrant profile 140, and the third electrode 175 is located adjacent to the edge 45 of the post 20 in the second reentrant profile 145. The second electrode 170 and the third electrode 175 are vertically spaced from the first electrode 180 due to the height of the electrically conductive gate structure 120. The third electrode 180 is in conformal contact with a third portion of the semiconductor layer on the top of the electrically conductive gate structure. The second electrode 170 and the first electrode 180 define a first channel having ends of the first transistor 100 and the third electrode 175 and the first electrode 180 define a second channel having ends of the second transistor 200.

As shown in FIG. 1a, in one example embodiment of the present invention, the gate layer 125 does not extend beyond the reentrant profile defined by the extension of the cap 30 over the edge 40 of post 20. In FIG. 2, another example embodiment of vertical transistors 102, 202 of the present invention is shown. The post 20 and cap 30 are identical in structure and function to those described in relationship to FIGS. 1a and 1b, and should be understood. Additionally, the insulating layer 130, semiconductor layer 150, electrodes 170, 175 and 180, and reentrant profiles 140, 145 are also identical to those previously described. The embodiment of the conductive gate layer 225 shown in FIG. 2 extends beyond the reentrant profile defined by the extension of the cap 30 over the edge 40 of post 20, by a distance that is not greater than the thickness of the conductive gate layer. Additionally, the conductive gate layer 225 covers a portion of the edge of the cap 30, but does not extend over the top of the cap 30. The extension along the substrate of the gate layer 225 is a result of a process where the material of gate layer is used to mask the exposure of an etch resist. The conductive gate layer 225 has all of the benefits of the conductive gate layer of FIG. 1a.

FIG. 3 shows another example embodiment of the present invention where the conductive gate layer 325 extends beyond the cap by a distance that is not greater than the sum of the thickness of the conductive gate layer and the combined height 52 of the post 20 and cap 30. This embodiment provides additional protection and control for determining the ungated region at the base of the electrically conductive gate structure 120. As shown, the second electrode 370 is located in contact with a second portion of the semiconductor layer 350 not over the post and is over a portion of conformal conductive gate layer 325 that extends along the substrate, resulting in a vertical transistor having no ungated region at the base of the post. The extension of the conductive gate layer 325 along the substrate can be obtained by reflowing a polymeric resist, or by wicking a resist into the profile, as will be described in more detail in reference to FIGS. 24 and 29. Alternatively, a low resolution mask in a photolithographic process can be used. The conductive gate layer 325 can be advantageously sized to prevent an ungated region in the channel, and to minimize the overlap between the gate layer 325 and the electrode 370 for overall improved device performance over the prior art. The other components of FIG. 3, namely the post 20, cap 30, the insulating layer 330, semiconductor layer 350, and electrodes 370, 375 and 380 are identical in structure and function to those described in relationship to FIGS. 1a and 1b, and should be understood.

Vertical transistors 100 and 200 include a substrate 110, on which is positioned an electrically conductive gate structure 120. The electrically conductive gate structure 120 can include both conductor and insulator materials as described above, the only requirement being that the electrically conductive gate structure 120 has a conductive gate layer 125 in at least the reentrant profile 140, and preferably reentrant profiles 140 and 145. FIGS. 1a through 1b, and FIGS. 2 and 3 all have a post 20 and cap 30 that define a reentrant profile 140. As previously described, the post has a height dimension 50 and on top of the post 20, is a cap 30. The cap 30 covers the top of the post 20, and the cap 30 extends beyond the edge 40 of the post 20 to define a reentrant profile 140. The features of the reentrant profile can be better understood with reference to FIGS. 5a through 5f which each contain a closer cross-sectional view of reentrant profile 140 of a gate structure 121 formed from a post 20 and cap 30. As shown, reentrant profile 140 can have any shape that meets the requirement that it is defined by the extension of a cap 30 beyond the edge 40 of post 20. The reentrant profile is defined as the profile that lies within the boundaries of the cap 30, the substrate 110 and a line drawn orthogonal to the substrate from the edge of the cap at the point of furthest extension (as shown by lines P-P' in FIGS. 5a through 5f). To aid in understanding, the first reentrant profile 540a, 540b, 540c, 540d, 540e, and 540f in each figure is shown in bold. As shown, each reentrant profile has an associated depth, d, which is defined as the largest extension of the cap from the post, measured parallel to the substrate. FIG. 5a illustrates a simplified profile, which was used to demonstrate the embodiments of the present invention in FIGS. 1a, 2 and 3. As shown in FIGS. 5d and 5f, the cap 30 can have a non-uniform edge profile. FIGS. 5b, 5c, and 5f are all embodiments where the edges of the post are not straight vertical edges which are orthogonal to the substrate; instead they can have any profile as long as the edge does not extend beyond the end of the cap.

The gate layer 125 does not have portions over the cap 30, which differentiates it from the gate layer of other vertical transistors. Additionally, the gate layer 125 is confined within the reentrant profile in the region of the semiconductor channel in some embodiments, and in other embodiments, the gate layer does not extend beyond the reentrant profile by more than the sum of the thickness of the conductive gate layer 125, and the combined height 52 of post 20 and cap 30. Controlling the size and shape of the gate layer 125 provides vertical transistors with optimized overlap capacitance and manufacturing tolerance.

To better understand the requirements of the gate layer 125 of the present invention, we turn now to FIGS. 6a through 6d. FIG. 6a is a cross sectional view of one embodiment of the conductive gate structure 120 of the present invention. As shown in FIG. 6a, the gate layer 125 extends beyond the reentrant profile 140 by no more than the sum of the thickness of the conductive gate layer 125 and the combined height 52 of the post 20 and cap 30. FIG. 6b is an enlarged view of reentrant profile 140 of FIG. 6a. The relevant dimensions are indicated on FIG. 6b. The thickness of the conductive gate layer 125 is shown at t, and is measured orthogonal to a surface of the post 20. The conductive gate layer 125 is preferably a conformal layer of uniform thickness, and as such, the thickness taken at any point on the surface within the reentrant profile should be representative. The depth of the reentrant profile, d, is shown for reference and should be understood from FIGS. 5a through 5f. The combined height 52 of the post 20 and cap 30 is denoted by h.

The distance that the conductive gate layer 125 extends along the substrate is preferably limited to be t+h, as measured from the end of the cap 30 which is used to define the reentrant profile 140. The channel length of a vertical TFT using the conductive gate structure with this limitation, as shown in FIGS. 6a through 6d, is less than 2d+2h. A typical reentrant profile 140 will have a depth d that is no more than the combined height of the structure, in order to ensure the structural integrity of the final transistor. This means that the longest channel length of a vertical transistor of these embodiments is 4h. In some embodiments, the vertical transistor can have a combined height 52 of the post 20 and cap 30 that is under 1 micron, therefore the channel length of a vertical transistor of the present invention would be less than 4 microns, which can be fabricated without the need for sub 5-micron patterning techniques. It should be understood that the placement of the source and drain electrodes (electrodes 170 and 180 in FIG. 1a) ultimately sets the channel length, however, the length of the gated region plays a role in transistor operation. In preferred embodiments of the present invention, the vertical transistor will have a channel length of less that 2(d+t)+h, in other embodiments the vertical transistor of the present invention will have a channel length of less than 3 microns. In other embodiments, the vertical transistor can have a channel length of less than 1 micron.

The structures shown in FIGS. 6a, 6c and 6d illustrate embodiments of the conductive gate structure 120 of the present invention that meet the requirement of the gate layer 125 extending beyond the reentrant profile by no more than t+h. FIG. 6c illustrates an embodiment where the conformal conductive gate layer 125 includes a portion that extends along the substrate, but does not extend beyond the cap by more than t+h. As shown in FIG. 6c, the distance that the conductive gate layer 125 extends along the substrate is t, as measured from the end of the cap 30 which is used to define the reentrant profile 140. This structure can be obtained when the material of the conductive gate layer 125 can block the exposure of a resist within the reentrant profile. Typical resists used in processing are UV sensitive, and to prevent the exposure of the resist in the reentrant profile, the material of the conductive gate layer needs to block the UV exposing light. In this embodiment, it is preferred that the conformal conductive gate layer includes a material that blocks more than 80% of light at wavelengths less than 400 nanometers. In other embodiments, the gate material blocks more than 90% of light at wavelengths less than 400 nanometers, and in other embodiments the gate material is opaque.

FIG. 6d shows an embodiment where the conformal conductive gate layer 125 includes a portion that extends along the substrate, but does not extend beyond the distance that the cap extends beyond the edge of the post. In some embodiments, the conformal conductive gate layer can be fully contained within the reentrant profile 140. FIG. 6d also illustrates a specific embodiment where the conformal conductive gate layer 125 has a portion that extends along the substrate to the distance that the cap extends beyond the edge of the post, where the edge of the portion extending along the substrate is aligned with the edge of the cap. This structure can be obtained when the material of the cap 30 can block the exposure of a resist within the reentrant profile. Typical resists used in processing are UV sensitive, and to prevent the exposure of the resist in the reentrant profile the material of the cap 30 needs to block the UV exposing light. In this embodiment, it is preferred that the cap 30 includes a material that blocks more than 80% of light at wavelengths less than 400 nanometers. In other embodiments, the cap material blocks more than 90% of light at wavelengths less than 400 nanometers, and in other embodiments the cap material is opaque. In the embodiment shown in FIG. 6d, the material of the conductive gate layer can be transparent to UV light or only partially block the UV spectrum.

The embodiments discussed thus far, have gate structures 121 which are formed from a post 20 and a cap 30. In other example embodiments, the gate structure 121 can be formed of a single material or any combination of materials, which have a reentrant profile. In such embodiments, a thin film transistor includes a substrate and a post on the substrate, the post having a height dimension extending away from the substrate to a top portion of the post, the top portion of the post extending a distance beyond a bottom portion of the post in a direction parallel to the substrate to define a reentrant profile. A conformal conductive gate layer is on an edge of the post in the reentrant profile and not over the top portion of the post, the conformal conductive gate layer including a portion that extends along the substrate to the distance that the top portion of the post extends beyond the bottom portion of the post. A conformal insulating layer is on the gate layer in the reentrant profile. A conformal semiconductor layer is on the insulating layer in the reentrant profile. A first electrode is located in contact with a first portion of the semiconductor layer over the top portion of the post and a second electrode is located in contact with a second portion of the semiconductor layer not over the top portion of the post.

FIG. 7a illustrates one alternative conductive gate structure which is formed using post 720, having a first reentrant profile 740 and a second reentrant profile 745, and conductive gate layer 725. Here the post 720 is equivalent in function and structure to gate structure 121. As shown, vertical transistor 107 has a conductive gate layer 125 that is in contact with an edge 47 of the post 720 and within the reentrant profile 740, the insulating layer 730 is in contact with the gate layer 725, and the semiconductor layer 750 is in contact with insulating layer 730. The first electrode 780 is located in contact with a first portion of the semiconductor layer over the top portion of the post; and the second electrode 770 located in contact with a second portion of the semiconductor layer not over the top portion of the post. Vertical transistors 107 and 207 are comparable to vertical transistor 100 and 200 of FIGS. 1a and 1b in operation and composition, with the exception that post 20 and cap 30 have been replaced with post 720.

As shown, the post has another edge 40 along the height dimension, the top portion of the post extending a distance beyond a bottom portion of the post in a direction parallel to the substrate to define a second reentrant profile 745. A third electrode 775 is located in contact with a third portion of the semiconductor layer 750 over the substrate 110 and not over the post 720 and adjacent to the other edge 40 in the second reentrant profile 745. The operation and details of transistor 107 and 207 should be understood from the descriptions of the previous embodiments.

FIGS. 8a through 8d are the single post 720 corollaries to the post 20 and cap 30 structures shown in FIGS. 5a through 5f. As shown in FIGS. 8a through 8d, the depth, d, of the reentrant profile 740 is defined as the longest extension of the post 720 measured parallel to the substrate 110. The post 720 has a height dimension 752 extending away from the substrate 110 to a top portion 702 of the post 720, the top 702 portion of the post extending a distance beyond a bottom portion 704 of the post 720 in a direction parallel to the substrate 110 to define a reentrant profile 740. The top portion 702 of the post 720 includes the top of the post, and is defined by the portion of the post 720 between the longest extension of the post 720 and the top of the post. In some embodiments, the top portion 702 of the post 720 includes only the top of the post, since the top of the post defines the point of longest extension. The bottom portion 702 of the post 720 includes the bottom of the post 720, where the post 720 meets the substrate 110, and is defined by the portion of the post 720 between the substrate 110 and the deepest portion of the reentrant profile 740. In some embodiments, the bottom portion 704 of the post 720 includes only the bottom of the post, since the bottom of the post defines the depth of the reentrant profile 740. The height 752 of the post 720 is measured from the bottom of the post to the top of the post.

The reentrant profile 740 in FIGS. 8a through 8d is shown in bold. In some embodiments, the longest extension of the structure is at the top of the structure as shown in FIGS. 8a, 8b and 8c. In other embodiments, there can be a portion, the top portion 702, of the post 720 above the reentrant profile 740 as shown in FIG. 8d. In preferred embodiments, the depth of the profile is measured between the longest extension of the post 720 and the point where the structure intersects the substrate as shown in FIGS. 8a, 8c and 8d. In alternative embodiments, the depth d of the reentrant profile 740 can be set by a feature in the post 720 edge between the top and bottom of the structure as shown in FIG. 8b, which also serves to define the bottom portion 704 of the post 720.

FIGS. 9a and 9b illustrate the relationship between height 752 of the post 720 and the conductive gate layer 125. The gate layer 125 does not have portions over the post 720, which differentiates it from the gate layer of other vertical transistors. Additionally, the gate layer 125 is confined within the reentrant profile in the region of the semiconductor channel in some embodiments, and in other embodiments the gate layer does not extend beyond the reentrant profile by more than the sum of the thickness of the conductive gate layer 125, the height 752 of post 720. Controlling the size and shape of the gate layer 125 provides vertical transistors with optimized overlap capacitance and manufacturing tolerance.

FIG. 9a is a cross sectional view of one embodiment of the conductive gate structure 721 of the present invention. As shown in FIG. 9a, the gate layer 725 extends beyond the reentrant profile 740 by no more than the sum of the thickness, t, of the conductive gate layer 725 and the height 752 of the post 720. FIG. 9b is an enlarged view of reentrant profile 740 of FIG. 9a. The relevant dimensions are indicated on FIG. 9b. The thickness of the conductive gate layer 725 is shown at t, and is measured orthogonal to a surface of the structure 720. The conductive gate layer 725 is preferably a conformal layer of uniform thickness, and as such the thickness taken at any point on the surface within the reentrant profile should be representative. The depth of the reentrant profile, d, is shown for reference and should be understood from FIGS. 8a through 8d. The height 752 of the post 720 is denoted by h. In preferred embodiments, the distance that the conductive gate layer 725 extends beyond the reentrant profile on the substrate surface is no more than t+h, as measured from the top portion 702 of the post 720. In embodiments using the conductive gate layer 125 of FIG. 9a, the second electrode 770 can be located in contact with a second portion of the semiconductor layer 150 that is not over the top portion of the post, and is over a portion of conformal conductive gate layer 125 that extends along the substrate. This extension of conductive gate layer 125 along the substrate, and overlap with second electrode 770, prevents an ungated region at the bottom of the post 720.

FIG. 9c illustrates an embodiment where the conformal conductive gate layer 125 includes a portion that extends along the substrate, but does not extend beyond the top portion 702 of post 720 by more than t. As shown in FIG. 9c, the distance that the conductive gate layer 125 extends along the substrate is t, as measured from the end of the top portion 702 which is used to define the reentrant profile 740. This structure can be obtained when the material of the conductive gate layer 125 can block the exposure of a resist within the reentrant profile. Typical resists used in processing are UV sensitive, and to prevent the exposure of the resist in the reentrant profile the material of the conductive gate layer needs to block the UV exposing light. In this embodiment, it is preferred that the conformal conductive gate layer includes a material that blocks more than 80% of light at wavelengths less than 400 nanometers. In other embodiments, the gate material blocks more than 90% of light at wavelengths less than 400 nanometers, and in other embodiments the gate material is opaque.

The post 720 can be used to block the light used to expose a photo resist. In these embodiments, the conformal conductive gate layer 125 includes a portion that extends along the substrate, but does not extend beyond the distance that the top portion of the post extends beyond the bottom portion of the post. In some embodiments, the conformal conductive gate layer can be fully contained within the reentrant profile 740. In other embodiments, the conformal conductive gate layer 125 has a portion that extends along the substrate to the distance that the top portion of the post extends beyond the bottom portion of the post. This structure can be obtained when the material of the post 720 can block the exposure of a resist within the reentrant profile. In this embodiment, it is preferred that the post 720 includes a material that blocks more than 80% of light at wavelengths less than 400 nanometers. In other embodiments, the post material blocks more than 90% of light at wavelengths less than 400 nanometers, and in other embodiments the post material is opaque.

The channel length of a vertical TFT using the conductive gate structure shown in FIGS. 9a through 9c would be less than 2d+2h. A typical reentrant profile 740 will have a depth d that is no more than the height 752 of the post 720. This means, in some embodiments the channel length of a vertical transistor is 4h or less. It should be understood that the placement of the source and drain electrodes (electrodes 770 and 780 in FIG. 7a) will ultimately set the channel length, however the length of the gate region plays a role in transistor operation. In preferred embodiments of the present invention the vertical transistor will have a channel length of less than 2h.

In some example embodiments of the present invention, it is desirable to coat post 20 and cap 30, or post 720, with a conformal dielectric layer prior to depositing the conductive gate layer 125. In these embodiments, a conformal dielectric layer is on the edges of the post, and at least a portion of the substrate. The conformal dielectric layer is located at least between the conformal conductive gate layer and the post. As shown in FIG. 10a, the thickness of the dielectric layer is taken into consideration when considering the location of the conductive gate layer 125 within reentrant profile 140. The conductive gate layer 125 can extend beyond the reentrant profile by the sum of the thickness of the dielectric layer, the thickness of the conductive layer and the combined height 52 of the post and cap. Elements of the structure illustrated in FIG. 10a can be combined and depicted as a post 720, as illustrated by FIG. 10b. As such, the post 720 is the combination of the post 20, cap 30 and conformal dielectric layer 115, and has an associated height 752. As discussed above, the distance that the conductive gate layer 725 extends beyond the reentrant profile on the substrate surface is preferred to be no more than t+h, as measured from the top portion 702 of the post 720.

Figure 11:
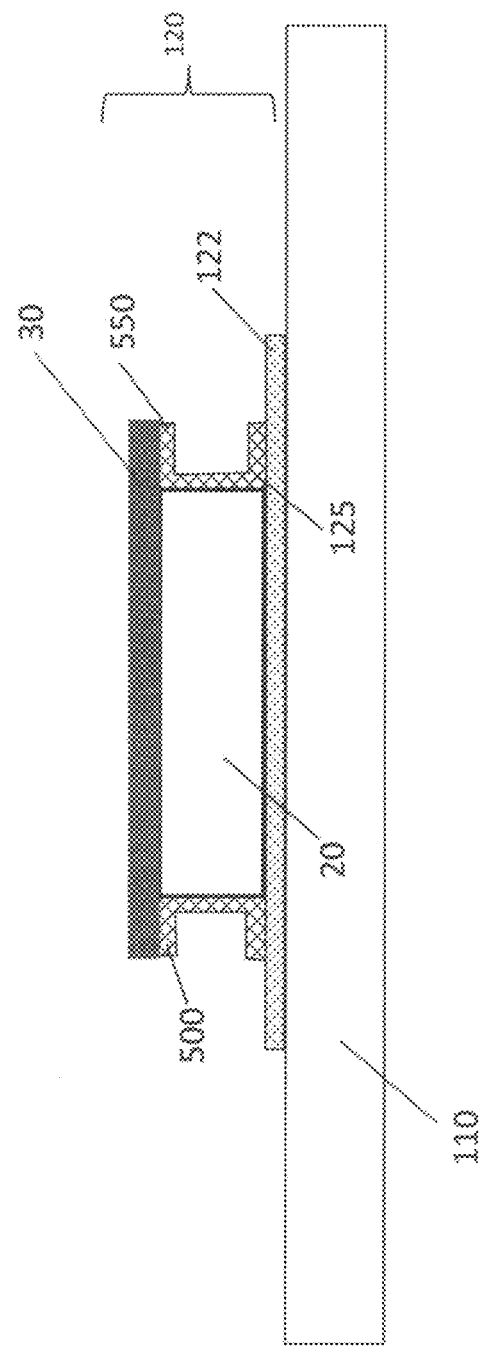

FIG. 11 is an embodiment of the present invention having a post 20 and inorganic cap 30. Preferably, both the post 20 and cap 30 are insulating in the embodiment shown in FIG. 11. In this embodiment, the two sections of the conductive gate layer 125, are each confined to be within the dimensions of the first and second reentrant profiles 140 and 145, and do not extend beyond the distance that the cap 30 extends beyond of the post on the substrate. The two sections 500,550 of the gate layer 125 are connected to a separate conductive layer 122 which serves to physically and electrically connect the two portions gate layer 125 forming two transistors in series as a variation of the embodiment shown in FIG. 1a. The vertical transistors having the electrically conductive gate structure 120 of FIG. 11 function in the same manner as the vertical transistors 100 and 200 of FIGS. 1a and 1b. In some embodiments, the conductive material layer 122 is positioned at least under a portion of the post and in electrical contact with the conformal conductive gate layer 125. In other example embodiments, post 720 can be used in place of the post 20 and cap 30 shown in FIG. 11, where the conductive material layer 122 is positioned at least under a portion of the post 720 and in electrical contact with the conformal conductive gate layer 125.

FIG. 12 is another embodiment of the present invention having a conductive layer 122 which connects the two portions of the gate layer 125. In this embodiment, the conductive material layer 122 and the cap 30 are vertically aligned and have the same pattern within the area of the transistor. This structure can be made by forming the cap 30 photolithographically, using the pattern of the conductive layer 122 as a mask (exposing through the substrate). In this embodiment, conductive layer 122 serves to physically and electrically connect the two portions of gate layer 125. The vertical transistors having the gate layer 125 of FIG. 12 function in the same manner as the vertical transistors 100 and 200 of FIGS. 1a and 1b. In other example embodiments, post 720 can be used in place of the post 20 and cap 30 shown in FIG. 12, resulting in a transistor where the conductive material layer 122 and the top portion 702 of the post 720 are vertically aligned and have the same pattern within the area of the transistor.

FIG. 13 is an embodiment of the present invention of the post 20, cap 30 and gate layer 125 which when used in place of the elements in FIG. 1a results in two separate vertical transistors that are on opposite sides of the post 20. In this embodiment the conductive layer 122 is patterned to be discontinuous, so that there is no connection under the post 20. When used in vertical transistors of the present invention, the second electrode 170 and third electrode 175 can be located adjacent to the first and second reentrant profiles 140,145 respectively, on either side of post 20, not over the cap 30, and the first electrode 180 can be common, over the cap 30, and function as an electrode for both vertical transistors formed using a single post 20 and cap 30. Alternatively, the two transistors can be completely separate by splitting the first electrode 180, over the cap 30, into two separate electrodes; such that the two separate vertical transistors are formed using a single post 20 and cap 30 (as described in co-pending patent application Ser. No. 14/198,628, entitled VTFT WITH POLYMER CORE, Ellinger et al.)

Some embodiments of the present invention are directed to vertical transistors having an electrically conductive gate structure 120 having a reentrant profile with a conductive gate layer 125 that is "self-aligned" within the reentrant profile. As used herein, the term "self-aligned" indicates that the structure provides the critical features used for patterning as opposed to using an external mask. The location of the edges of layers patterned in a "self-aligned" manner, are not required to be exactly vertically aligned to an edge portion of the structure providing the pattern. Details of the processes can be used to vary this position. There are two methods of using a structure with a reentrant profile to form a "self-aligned" gate layer. The first is an exposure method wherein the structure or the material of the conductive gate layer is light blocking. The second is a printing method where the reentrant profile of the structure induces capillary action in a printed resist. To better understand the exposure method of the present invention, a step diagram for a process of making the electrically conductive gate structure with "self-aligned" conductive gate layer for use in vertical transistors of the present invention is shown in FIG. 14.

Figure 14:
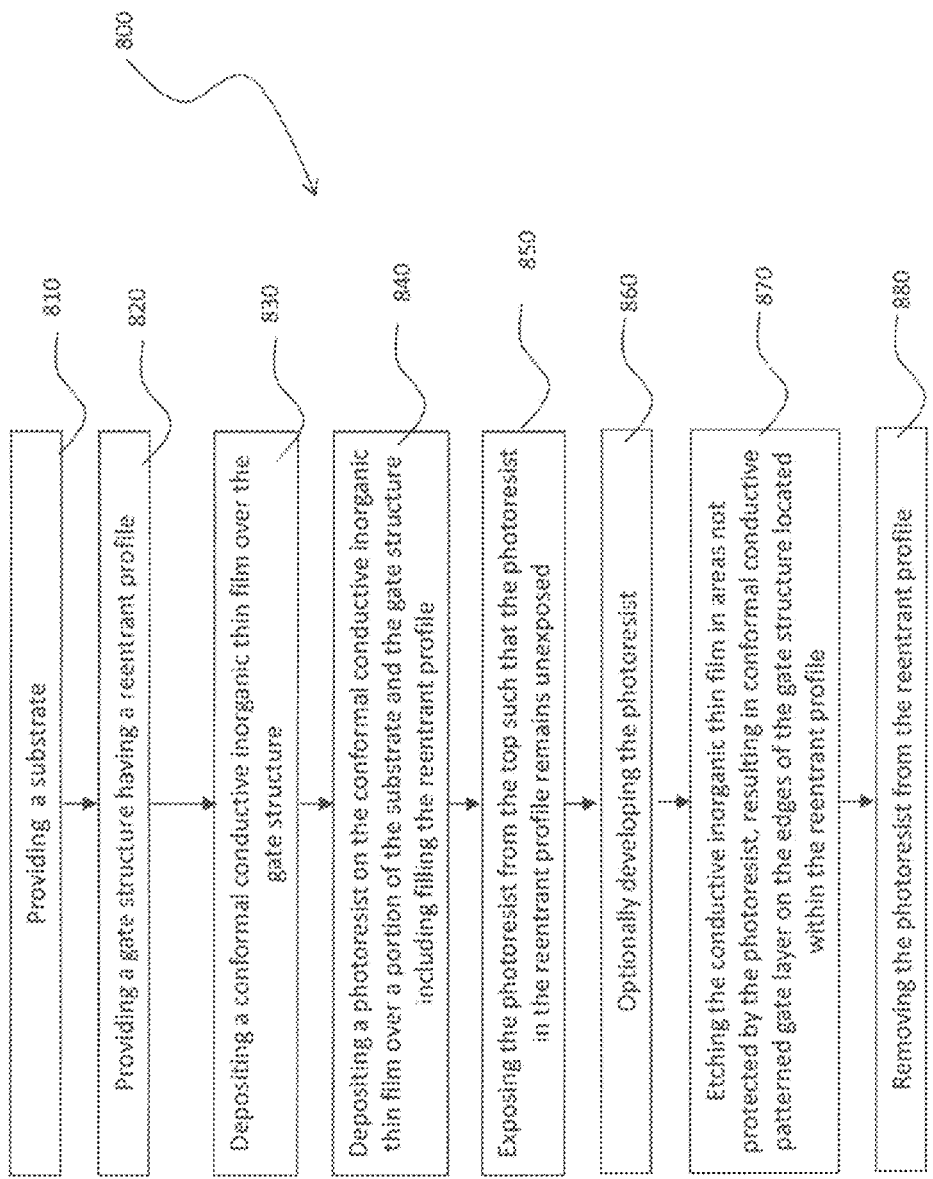
FIG. 14 is a flow chart describing an example embodiment of a process of forming an electrically conductive gate structure of the present invention.

The step diagram of FIG. 14 details the process steps for forming a gate layer of a thin film transistor, including providing a substrate including a gate structure having a reentrant profile. A conformal conductive inorganic thin film is deposited over the gate structure and in the reentrant profile. A photoresist is deposited on the conformal conductive inorganic thin film over the gate structure and filling the reentrant profile. The photoresist is exposed from a side of the photoresist opposite the substrate allowing the photoresist in the reentrant profile to remain unexposed. The conformal conductive inorganic thin film is etched in areas not protected by the photoresist to form a patterned conductive gate layer located in the reentrant profile of the gate structure.

As shown in Step 810, a substrate is provided into the system. The substrate may be any substrate as discussed that is suitable for use with the vertical transistors of the present invention. Providing the substrate can include providing a patterned conductive layer on the substrate prior to providing the gate structure. In Step 820, a gate structure having a reentrant profile is provided. The gate structure can be conductive or insulating, and has a reentrant profile. Although the gate structure can be provided by any manufacturing process, FIGS. 15a and 15b outline process flows for useful methods of providing the gate structure.

Figure 15A:
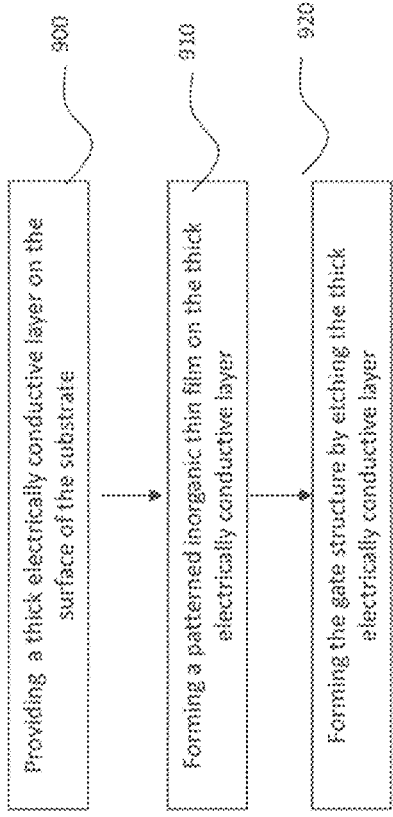
FIGS. 15a and 15b are flow charts describing example embodiments of providing a gate structure of the present invention.

Turning first to FIG. 15a, Step 820 is accomplished by forming an electrically conductive gate structure. In Step 900, a thick electrically conductive layer is provided on the surface of the substrate. As used herein, thick electrically conductive layer is defined to have a thickness greater than 300 nm and less than 2 microns. The thickness of the thick electrically conductive layer defines the height of the gate structure, and is therefore chosen with that in mind. The thick electrically conductive layer can be any of a variety of conductive materials known in the art including metals, degenerately doped semiconductors, conductive polymers, or printable materials such as carbon ink, silver-epoxy, or sinterable metal nanoparticle suspensions. For example, the electrically conductive material layer can include doped silicon, or a metal, such as aluminum, chromium, gold, silver, nickel, copper, tungsten, palladium, platinum, tantalum, or titanium. Conductive materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used. The first electrically conductive material layer can be deposited on the substrate using chemical vapor deposition, sputtering, evaporation, doping, or solution processed methods.

Next, in Step 910, a patterned inorganic thin film is formed on the thick electrically conductive layer. The patterned inorganic thin film can be an insulating material, a semiconducting material, or a second electrically conducting material. The patterned inorganic thin film can be provided in any means known in the art including, but not limited to, uniform deposition followed by patterning using photolithography and etching or selective area deposition.

Next Step 920, the electrically conductive gate structure is formed by etching the thick electrically conductive layer, using the patterned inorganic thin film as a hard mask. The thick electrically conductive layer is etched such that a portion of patterned inorganic thin film layer extends beyond the remaining portion of the thick electrically conductive layer, forming a reentrant profile. The gate structure formed as a result of the process of FIG. 15a will have an electrically conductive post with an inorganic cap that extends beyond the edges of the post in at least the width dimension.

Figure 15B:
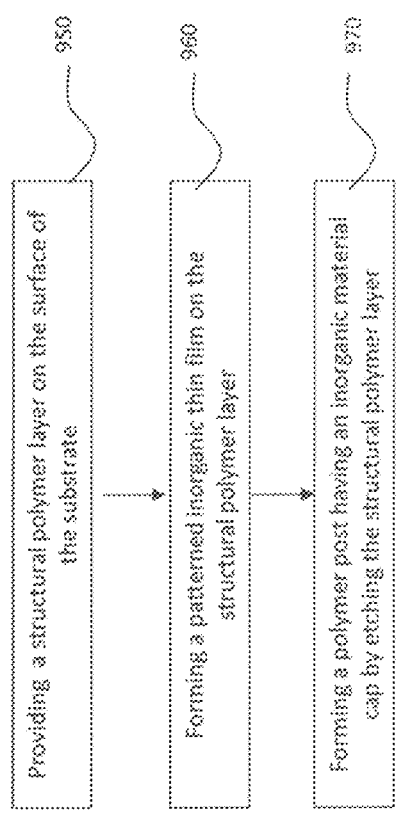

Another example embodiment of a process for providing the gate structure (Step 820) is shown in FIG. 15b. The steps of FIG. 15b result in a gate structure formed from a structural polymer post having an inorganic cap; this structure is preferably an insulating structure. First in Step 950, a structural polymer layer is provided on the surface of the substrate. The structural polymer can be any polymer that is stable in the final vertical transistor structure and should be understood from the previous description. In this step, the structural polymer layer can cover only a portion of the substrate. The structural polymer can be deposited in any method known in the art, including, but not limited to spin coating, spray coating, curtain coating, slot die other uniform coating methods, coating, gravure, screen printing, lamination, or flexography. Providing the structural polymer can include steps of drying, curing, cross-linking, or treating.

In Step 960, a patterned inorganic thin film is formed on the structural polymer layer. This step is preferably done using ALD, more preferably using spatial ALD. It is preferred that the inorganic thin film be a dielectric material. Prior to forming the patterned inorganic thin film, the surface of the structural polymer layer can be optionally treated (not shown). The treatment can be understood from the previous discussion and can include using UV-ozone or plasma processes. The inorganic thin film layer can be patterned as deposited in step 960 by using the combination of selective area deposition and ALD. Alternatively, the inorganic thin film layer can be deposited uniformly and patterned using any method known in the art, including photolithography and etching. The patterned inorganic thin film layer at least includes the pattern of the inorganic thin film cap.

In Step 970, the polymer post having an inorganic material cap is formed by etching the structural polymer layer. The polymer post having an inorganic material cap is formed by removing the portions of the structural polymer layer not covered by the patterned inorganic thin film, and portions of the structural polymer layer that are under the inorganic thin film to create a reentrant profile. The reentrant profile is defined by the inorganic thin film material overhanging the wall of the polymer post. This step can be done using two different processes, or preferably in a single process. In some embodiments that use selective area deposition, the patterned inhibitor layer can be removed prior to the removal of the portions of the structural polymer layer by a liquid process using a solvent or a detergent or by vapor process. Processes for forming the post include exposing the substrate to a vapor reactant that causes removal of the structural polymer. The removal can happen spontaneously upon reaction with the vapor, resulting in the conversion of the inhibitor to a volatile species. Alternatively, the vapor exposure can react with the structural polymer converting it to another species or morphology that is then more easily removable with another process, such as a liquid process. The vapor exposure can include forms of energy to promote the process. These include light exposure, and arcs or plasmas. Particularly desired light exposures include UV exposure, especially in the presence of oxygen to produce ozone. Plasmas include plasmas of various species including oxygen, chlorine, and fluorine. Plasmas created with these materials or with precursors that produce these materials are included in the present invention. The removal of portions of the structural polymer layer can be accomplished by a single exposure to a highly reactive oxygen processes including a UV-ozone process (UVO) or $O_2$ plasma. The highly reactive oxygen processes can be a batch process using a chamber based tool or continuous process using web process tools. The highly reactive oxygen processes can be at sub-atmospheric (vacuum) pressure or atmospheric pressure.

After the gate structure has been provided, Step 820, and prior to completing Step 830 in FIG. 14, the gate structure as well as portions of the substrate, can optionally be covered with a conformal dielectric layer (not shown). This dielectric layer provides a uniform material surface on which to deposit the gate layer, which can increase the overall quality of the gate layer. If the optional dielectric layer is used, the gate structure now includes the post, cap and conformal dielectric layer which has a reentrant profile.

Once the gate structure has been provided in Step 820, a conformal conductive inorganic thin film is formed over and in contact with the gate structure in Step 830. The conductive inorganic thin film is a conformal conductive layer that is preferably deposited using an ALD process, and more preferably by a spatial ALD process. Conformal coating implies that electrically conductive material layer deposits with a substantially uniform thickness even in the reentrant profiles of the gate structure. The conductive layer can be a single layer, or be a multilayer stack. The conductive inorganic thin film layer can be a metal, or in some preferred embodiments a conductive metal oxide.

After deposition of the conformal conductive inorganic thin film layer, it needs to be patterned in a self-aligned manner to form the conductive gate layer. To that end, Step 840 describes depositing a photoresist on the conformal conductive inorganic thin film over the gate structure including filling the reentrant profile. A photoresist as used herein is any polymer material that is photo-patternable. The photoresist is preferably a positive resist, such that the resist is removed where it is exposed and remains in portions that are protected from exposure. A preferred photoresist is PMMA. Depositing the photoresist can be done using any method known in the art, including, but not limited to, spin coating, spray coating, curtain coating, slot die coating, gravure, screen printing, lamination, or flexography. Depositing the photoresist can include steps of drying or treating.

After depositing the resist, it is patterned as described in Step 850 by exposing the photoresist from the top such that the photoresist in the reentrant profile remains unexposed. Here, exposing from the top refers to exposing the photoresist from a side of the photoresist opposite substrate. The exposing can include using a wavelength of light which will effectively expose the photoresist. In some embodiments the composition of the gate structure will block the light from exposing the photoresist, resulting in resist remaining within the reentrant profile, but not on the top of the structure. In these embodiments, the step of providing the gate structure includes providing a gate structure that blocks more than 80% of light at wavelengths less than 400 nanometers. In other embodiments, the gate structure blocks more than 90% of light at wavelengths less than 400 nanometers, and in other embodiments the gate structure is opaque.

In other embodiments, the conductive thin film layer blocks the light from exposing the photoresist, resulting in resist remaining within the reentrant profile, including a portion which extends out on the substrate by the thickness of the conductive thin film. In these embodiments, the step of depositing conductive thin film layer includes depositing a thin film that blocks more than 80% of light at wavelengths less than 400 nanometers. In other embodiments, the deposited conductive thin film layer blocks more than 90% of light at wavelengths less than 400 nanometers, and in other embodiments the deposited conductive thin film layer is opaque. In some embodiments where the light is blocked by the conductive thin film, the region protected from full exposure may extend beyond the reentrant profile due to optical effects due to the structure and the thickness of the photoresist. Exposing the resist can include the use of a low resolution mask which is used to define features that are not near the reentrant profile. In other embodiments, exposing the resist can include using an oxygen plasma process.

After exposing the resist, the resist can be optionally developed in Step 860 to remove the exposed portions of the resist. In other example embodiments, the act of exposing the resist in Step 850 also removes the resist without the need for a development step. After the resist has been exposed, and optionally developed, the resist can be treated, including heated to cause reflow. The reflowing of the resist will cause the resist to protect the conductive material layer at the substrate level extending from the reentrant profile. In some embodiments the shape and position of the remaining photoresist is further modified by a plasma etching step.

Once the resist has been fully patterned, the conductive inorganic thin film is etched in areas not protected by the photoresist, resulting in a conformal conductive patterned gate layer on the edges of the gate structure located within the reentrant profile as shown in Step 870. Etching can be done using wet etch or dry etch processes.

After the forming the conformal conductive patterned gate layer, the photoresist is removed from the reentrant profile in Step 880 to provide a clean gate surface for depositing the gate dielectric on. Removing the resist can include wet chemical means or dry etching means, or a combination of multiple processes. For example the resist can be removed first using a solvent rinse, and then "descummed" using an oxygen plasma process. After completing the process flow of FIG. 14, a conductive gate structure has been formed that is useful in vertical transistors of the present invention.

Figure 16:
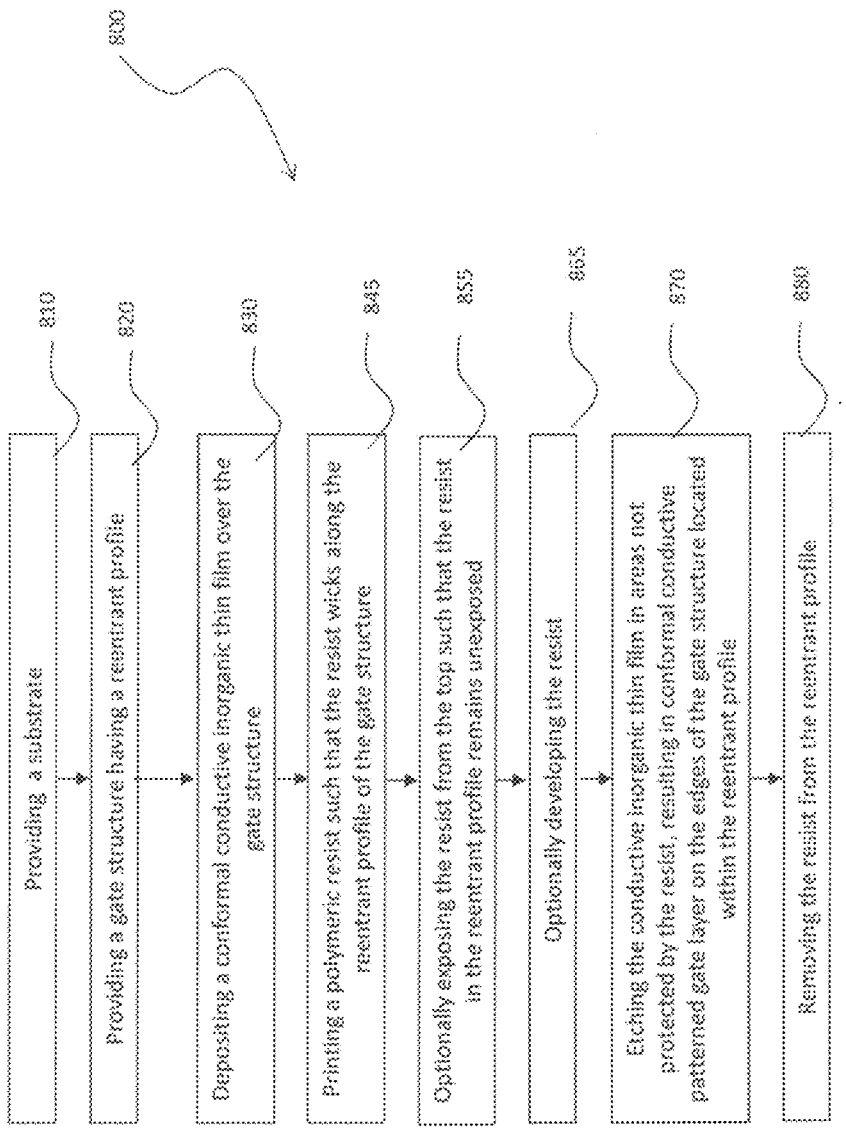
FIG. 16 is a flow chart describing an example embodiment of a process of forming an electrically conductive gate structure using wicking.

Another example embodiment for forming the conductive gate structure using a printing method where the reentrant profile of the structure induces capillary action in a printed resist is shown in FIG. 16. In this process flow, forming a gate layer of a thin film transistor includes providing a substrate including a gate structure having a reentrant profile. Next, a conformal conductive inorganic thin film is deposited over the gate structure followed by printing a polymeric resist that wicks along the reentrant profile of the gate structure. The conformal conductive inorganic thin film is then etched in areas not protected by the polymeric resist to form a patterned conductive gate layer located in the reentrant profile of the gate structure.

Step 810, providing a substrate; Step 820, providing a gate structure having a reentrant profile on the surface of the substrate; and Step 830, depositing a conformal conductive inorganic thin film over the gate structure are the same as those in FIG. 14 and should be understood from the previous description. In Step 845, a polymeric resist is printed such that the resist wicks along the reentrant profile of the gate structure. The reentrant profile is of a length scale that will cause capillary flow of a liquid along the length of the profile. Printing the resist includes printing a pattern which has an open area over the gate structure so that the resist "ink" will wick along the reentrant profile from two edges and meet to fully protect the conductive material layer within the region which will contain the channel of the transistor. Printing the resist includes using inkjet, flexography or any other patternwise print method known in the art which deposits a sufficient amount of resist ink to wick along the reentrant profile. Fluid properties of the resist ink and interactions with the surface of the electrically conductive layer in the reentrant profile will influence the wicking process. Printing the resist can include drying and crosslinking.

After printing, the resist can be optionally exposed from the top such that the resist in the reentrant profile remains unexposed, as called for in Step 855. Optionally exposing the resist can be used to in order to clean up any resist that wet the surface of the substrate outside of the reentrant profile, or that was unintentionally deposited on the top of the gate structure. In Step 855, either the gate structure or the conductive thin film layer protects the resist within the reentrant profile from being exposed. If the resist has been optionally exposed, it can optionally be developed in Step 865 to remove the exposed resist.

Once the resist has been fully patterned, the conductive inorganic thin film is etched in areas not protected by the photoresist, resulting in a conformal conductive patterned gate layer on the edges of the gate structure located within the reentrant profile as shown in Step 870 (as was described with reference to FIG. 14). Etching can be done using wet etch or dry etch processes. After the forming the conformal conductive patterned gate layer, the photoresist is removed from the reentrant profile in Step 880 to provide a clean gate surface for depositing the gate dielectric and the formation of the conductive gate layer is complete.

Figure 17:
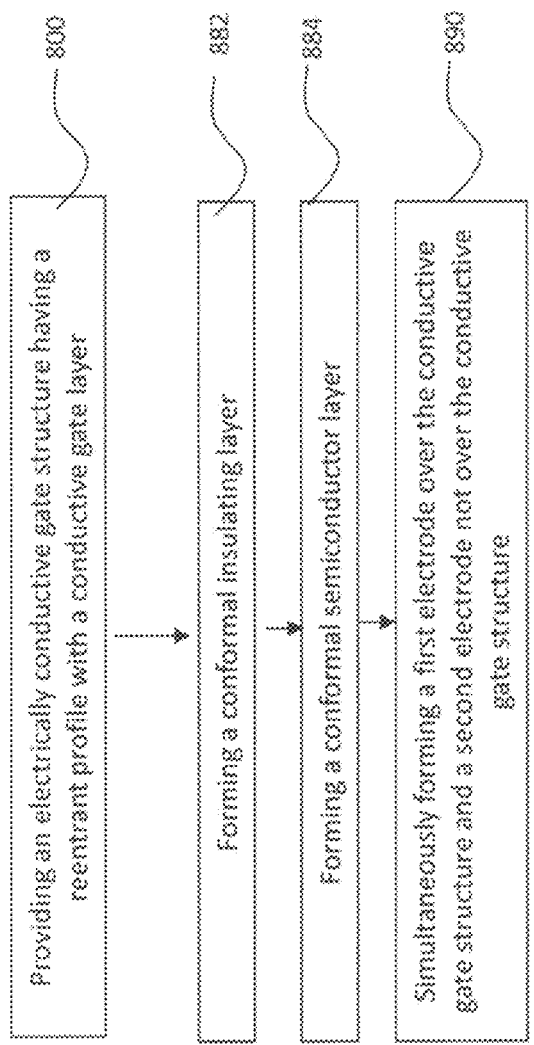
FIG. 17 is a flow chart describing an example embodiment of using an electrically conductive gate structure of the present invention to form a vertical transistor of the present invention.
Figure 18B:
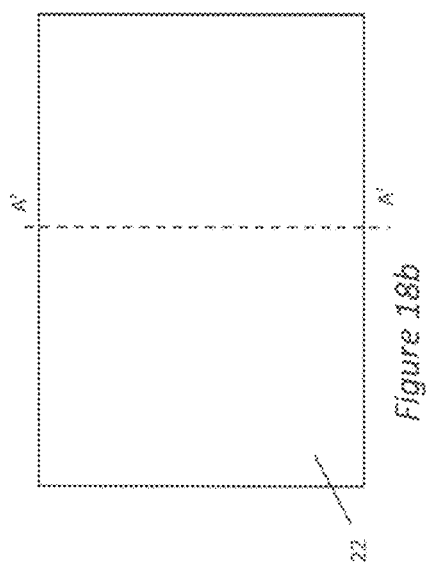

Either process flow from FIG. 14 or 16 is useful for forming the electrically conductive gate structure of the present invention. A step diagram for a process of completing the vertical transistor after forming the electrically conductive gate structure is shown in FIG. 17. As shown in FIG. 17, Step 800, providing an electrically conductive gate structure having a reentrant profile with a conductive gate layer can be accomplished using either the method of FIG. 14 or FIG. 16.

Once the gate structure has been provided in Step 800, a conformal insulating layer is formed over and in contact with electrically conductive gate structure in Step 882. The insulating layer is a conformal dielectric layer that is preferably deposited using an ALD process, and more preferably by a spatial ALD process. Conformal coating implies that electrically insulating material layer deposits with a substantially uniform thickness even in the reentrant profile of electrically conductive gate structure. The electrically insulating layer is often referred to as a gate dielectric. A dielectric material is any material that is a poor conductor of electricity, and should be understood from the previous descriptions. Preferably, the insulating layer is an inorganic thin film dielectric layer. The insulating layer can be patterned at the time of deposition using a selective area deposition process or can be deposited uniformly and patterned using standard photolithographic techniques. Typically, the patterned insulating layer includes vias to the gate layer for making contact in future processing steps. The conformal insulating layer can be a single layer, or be a multilayer stack.

Next, the conformal semiconductor layer is formed in Step 884. The semiconductor is preferably a thin film inorganic material layer, for instance ZnO or doped ZnO. The conformal semiconductor layer can be patterned at the time of deposition using a selective area deposition process or can be deposited uniformly and patterned using standard photolithographic techniques. Preferably, the semiconductor layer is deposited using an ALD process and more preferably by a spatial ALD process. The semiconductor layer is in contact with the insulating layer at least over the portion electrically conductive gate structure within in the reentrant profile.

The conformal coating process used to deposit semiconductor material layer can be the same process used previously to coat the insulating material in Step 882. Alternatively, the conformal coating process can be different. A semiconductor is a material in which electrical charges can move but in which the concentration of electrical charges can be substantially modulated by external factors such as electrical fields, temperature, or injection of electrical charges from a neighboring material. The semiconductor material acts as a channel between source and drain electrodes when the electrically conductive gate layer stack is energized, so it is important that the conformally coated semiconductor material be provided with a consistent or uniform thickness at least in reentrant profile of electrically conductive gate structure. The semiconductor layer can be patterned at the time of deposition using a selective area deposition process or can be deposited uniformly and patterned using standard photolithographic techniques.

To complete the vertical transistor, the first and second electrodes are simultaneously formed in Step 890. In this step, a first electrode is formed over the conductive gate structure and a second electrode is formed which is not over the conductive gate structure. This can be accomplished by using a line-of-sight deposition process such as a metal evaporation process. In this embodiment, the portion of the structure which extends over beyond the edge of the post prevents the conductor metal from depositing within the reentrant profile. The metal can be further patterned after deposition using standard photolithographic techniques. Alternative line-of-sight deposition techniques include sputtering and reactive sputtering in order to deposit metals, alloys or conductive metal oxides. In other example embodiments, Step 890 includes using selective area deposition in combination with ALD to simultaneously form the first and second electrodes. In these embodiments an inhibitor is used to pattern a conductive thin film layer. The inhibitor is present in at least the reentrant profile, preventing the conductive thin film from depositing in the reentrant profile and specifically over the walls of the post. In some embodiments, where the inhibitor is present only within the reentrant profile, the conductive material is further patterned using standard photolithographic techniques. When using selective area deposition to define the first and second electrodes it is preferred to use ALD, and most preferred to use spatial ALD. The formation of the first and second electrodes defines the channel of the vertical transistor which includes the portion of the semiconductor over the wall of the post. Additionally, in all embodiments the simultaneous formation of the first and second electrodes results in a structure where the first electrode is located in contact with a first portion of the semiconductor layer over the gate structure and the second electrode located in contact with a second portion of the semiconductor layer over the substrate and not over the post. As such, the first and second electrodes are different distances from the substrate surface and the distance between the first and second electrodes is greater than zero when measured orthogonal to the substrate surface.

Figure 18A:
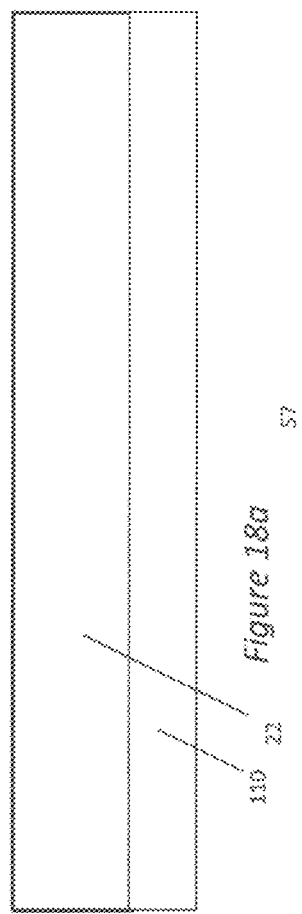

The process of forming the vertical transistor of the present invention can be better understood through the descriptive process build shown in FIGS. 18*a* and 18*b* through 26*a* and 26*b*. First, a substrate 110 is provided into the system. Next, a gate structure having a reentrant profile is provided as in Step 820 of FIGS. 14 and 16 resulting in a structure as shown in FIGS. 21*a* and 21*b*. Forming the gate structure 121 can be accomplished using any process known in the art, including the process flows described in FIGS. 15*a* and 15*b* which can be better understood with respect to FIGS. 18*a* and 18*b* through FIGS. 21*a* and 21*b*. FIG. 18*a* shows the result of coating a thick layer of material 22 on the substrate 110 surface. The material can be used to form the post of the gate structure, as shown in FIGS. 19*a*-20*b*, or alternatively can be formed into a gate structure having a reentrant profile without a cap by any process known in the art (not shown). Material 22 can be a thick electrically conductive layer, as shown in Step 900 of FIG. 15*a*. In other embodiments, material 22 can be a structural polymer layer as in Step 950 of FIG. 15*b*. In this step, the material layer 22 can cover only a portion of the substrate. In embodiments using a structural polymer layer it can be any polymer that is stable in the final vertical transistor structure and should be understood from the previous descriptions.

Figure 19B:
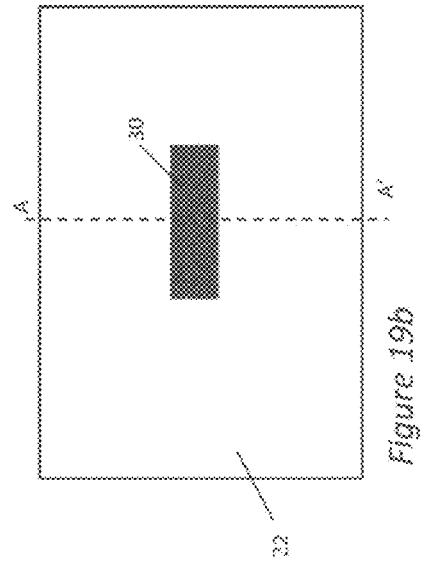
Figure 19A:
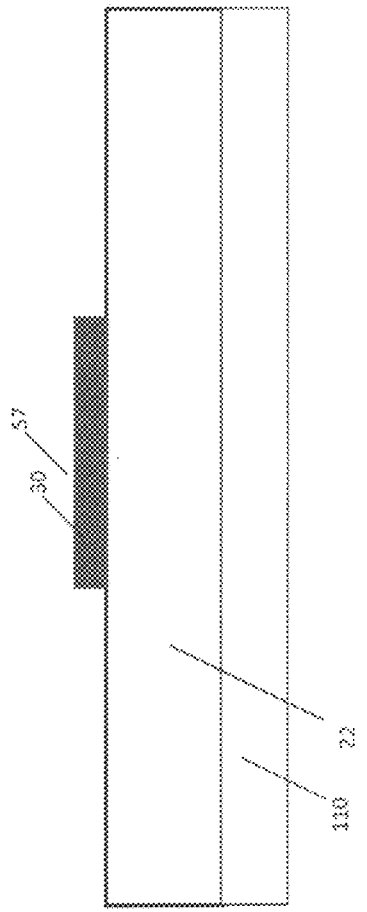

As shown in FIGS. 19*a* and 19*b*, after providing the material layer 22, a patterned inorganic thin film 57 is formed on top of the material layer 22 as in Step 910 of FIG. 15*a* or Step 960 of FIG. 16*b*. The patterned inorganic thin film 57 contains at least the pattern for the inorganic material cap 30 of gate structure 121. Providing the patterned inorganic thin film should be understood from the previous descriptions for FIGS. 15*a* and 15*b*.

Next, the post is formed resulting in the gate structure 121 shown in FIGS. 20*a* and 20*b*, where there is a cap 30 extending beyond the edge 40 of post 20 to define a reentrant profile 140. In embodiments where the material layer 22 is a thick electrically conductive layer, the gate structure 121 is formed by Step 920 of FIG. 15*a*, namely by etching the thick electrically conductive layer. In these embodiments the patterned inorganic thin film layer acts as a mask for etching the thick electrically conductive layer. In embodiments where material layer 22 is a structural polymer layer, the post is formed by Step 970 of FIG. 15*b*, namely by forming a polymer post having an inorganic material cap by etching the structural polymer layer. The process of removing material 22 can use any method known in the art including wet or dry etching processes, and should be understood from the previous descriptions. Removing the portions of the material layer 22 not covered by the patterned inorganic thin film 57, and portions of the material layer 22 that are under the inorganic thin film 57 results in the post 20 and cap 30 is shown in FIGS. 20*a* and 20*b*. The structure has a first reentrant profile 140 defined by the portion of the cap 30 overhanging the wall 40 of the post 20. The resultant post 20 has the same height as the thickness of the material layer 22, and a width 25 that is less than the width of the cap 30.

FIGS. 21*a* and 21*b* illustrate the result of Step 830 in FIGS. 14 and 16, depositing a conformal conductive inorganic thin film 127 over the gate structure 121. The conformal conductive inorganic thin film 127 can be deposited using any known conformal deposition process that coats inside of the reentrant profile 140. Preferably the conformal conductive inorganic thin film layer 127 is deposited using an ALD process, more preferably using a spatial ALD process.

Following the process outlined in FIG. 14 to form the electrically conductive gate structure 120, photoresist 41 is deposited on the conformal conductive inorganic thin film 127 and over a portion of the substrate 110 and the gate structure 121 including filling the reentrant profile as shown FIGS. 22*a* and 22*b* (Step 840). The deposition method can include, but is not limited to, spray-coating, spin-coating, ink-jet coating, or slot-die coating. The uniformity of thickness of the layer is not critical.

Next, the photoresist 41 is exposed from the top such that the photoresist in the reentrant profile remains unexposed as in Step 850 of FIG. 14. The exposure step is shown in FIGS. 23*a* and 23*b*. This exposure step causes the photoresist to be selectively exposed in a manner which is self-aligned to the gate structure 121. In one embodiment, the conductive thin film 127 is transparent to the light exposing the photoresist 41, and only the top portion of the gate structure 121 blocks the light from exposing the photoresist, as shown the cap 30 would block the light from exposing the photoresist. The result of this embodiment is shown in FIG. 24*a* after the completing Step 860 of developing the photoresist. In alternative embodiments, the conductive layer 127 blocks the light from exposing the photoresist 41, and the resist is protected in all locations where it is under the conductive layer 127. The result of this embodiment is shown in FIG. 24*c*. The cross-sectional views shown in FIGS. 24*a* and 24*c* can be understood with respect to the common plan view shown in FIG. 24*b*. As shown the photoresist is removed in all areas not protected by the gate structure 121 from exposure. Alternatively, a low resolution mask may be used in conjunction with the gate structure 121 to form portions of conductive gate layer 125 not within the reentrant profile (not shown). In all embodiments, the reentrant profile defines the exposure received by the photoresist near the gate structure, and not an external mask. In another embodiment, the resist material is either photo-patternable or not photo-patternable, but is removed by an energetic oxygen-containing process such that the reentrant profile 140 retains some resist which will be used to protect the conductive layer 127 from being removed from the reentrant profile during the etch step.

FIGS. 25*a* and 25*b* are representative of the structure after completing Step 870 of FIG. 14, using the photoresist pattern of FIG. 24*a*. As shown the photoresist remaining in the reentrant profile protects the conductive material layer 127 from being etched, resulting in the patterned conformal conductive gate layer 125. It should be understood that other conductive gate layers 125 are obtainable by choosing the materials, exposure conditions and process conditions to position the location of the edges of the photoresist within or near the reentrant profile. The previously described FIGS. 6*a* through 6*d*, 9*a* through 9*b* and 10*a*-*b* should provide one skilled in the art with an understanding of the range of conductive gate layers 125 that are obtainable by this self-aligned method of patterning a photoresist to be within the reentrant profile. FIGS. 26*a* and 26*b* show the structure after completing the process of FIG. 14 by removing the photoresist 41 from the reentrant profile 140 in Step 880. FIGS. 26*a* and 26*b* also illustrate the structure after Step 800 is completed thereby providing an electrically conductive gate structure 120 having a reentrant profile 140 with a conductive gate layer 125.

Figure 27B:
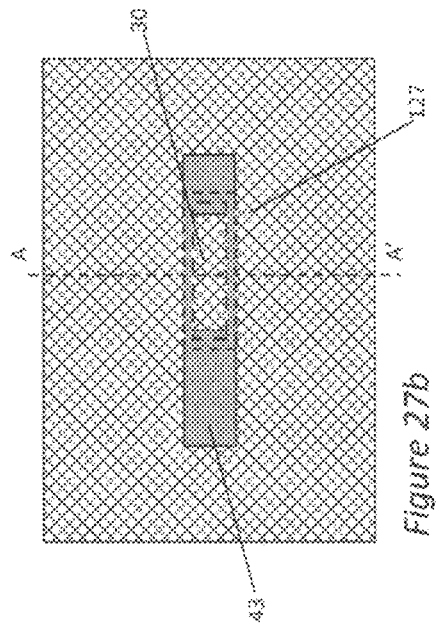
Figure 27A:
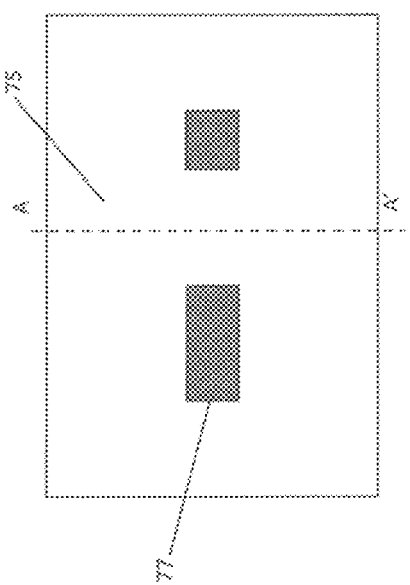
Figure 27C:
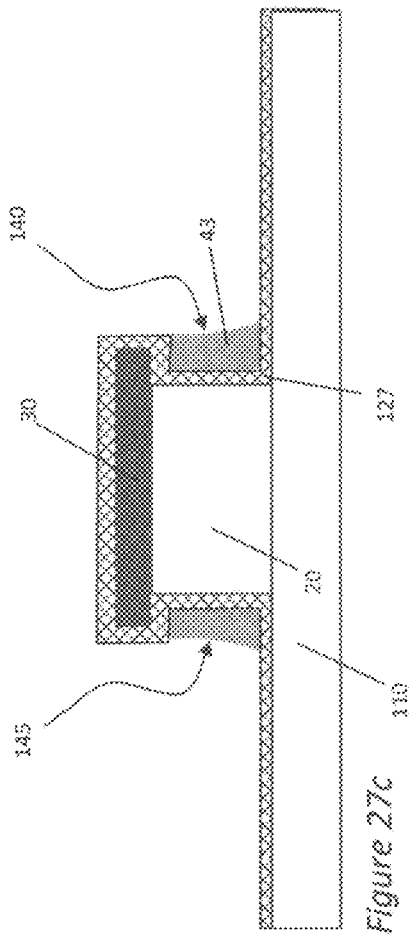

Alternatively, the photoresist can be introduced into the reentrant profile by printing the resist and having the resist fill the reentrant profile by capillary action. This printing method of FIG. 16 results in vertical transistors having the same structural features as those formed by the process of FIG. 14 where the resist is defined by exposure. FIGS. 27*a* through 27*c* illustrate the use of a printed resist to fill the reentrant profile 140. Here a patterned resist is printed such that the resist wicks along the reentrant profile in the length dimension of the post as in Step 845 of FIG. 16.

FIG. 27*a* illustrates the patterned to be printed. The area where no ink is to be printed is in white, and can be referred to as the open area 75; as designed, open area 75 contains no printed resist regions. The print pattern 77 is the region where ink deposition is requested. FIGS. 27*b* and 27*c* show the result of printing the resist 43 over a structure with reentrant profile 140; FIG. 27*c* is a cross-sectional view of FIG. 27*b* taken along the line A-A'. Although the area corresponding to the open area 75 of the pattern is uniform and free of directly printed resist, the liquid resist 43 ink wicks, or moves through capillary forces, into the reentrant profile 140. The fluid properties of the resist 43 ink will determine how wide of a transistor channel can be fabricated. Additionally, these properties in combination with the surface properties of the underlying layer(s) will determine the channel length as the liquid will also spread out on to the substrate surface.

FIGS. 28*a*-*c* and 29*a*-*c* further serve to explain how the resist pattern defining the gate layer is formed from a pattern with an open area over the gate structure 121. FIG. 28*a* shows a simple two line pattern 144. FIG. 28*b* shows individual printed drop locations 147 using the pattern of FIG. 28*a*. FIG. 28*c* illustrates the resultant resist pattern 148 when printing the pattern of FIG. 28*a* printed using an inkjet printer. As shown, an example is illustrated where the surface of the substrate 110 and structure 121 are hydrophilic and the ink is aqueous based. The relative surface energy of the structure and ink interface results in the ink traveling along the three sided capillary formed by the structure 121. FIGS. 29*a* through 29*c* are cross-sectional views taken along the lines A-A', B-B' and C-C' of FIG. 28*c*, respectively.

FIGS. 30*a* and 30*b* illustrate the results of completing the etching process of Step 870 of FIG. 16 and removing the resist from the reentrant profile in Step 880. FIGS. 30*a* and 30*b* also illustrate the structure after Step 800 is completed thereby providing an electrically conductive gate structure 120 having a reentrant profile 140 with a conductive gate layer 125. For ease of understanding how the electrically conductive gate structure 120 is used to form a vertical transistor, the descriptive process build in FIGS. 31*a* and 31*b* though FIGS. 33*a* and 33*b*, which illustrate the steps of the process diagram of FIG. 17, is discussed below.

FIGS. 31a and 31b illustrate the result of Step 882 in FIG. 17, forming a conformal insulating layer 130. The conformal insulating layer 130 can be patterned using a selective area deposition process, or in other embodiments of Step 882 the insulating material can be deposited uniformly and then patterned using standard photolithographic techniques—resulting in a patterned conformal insulating layer 130 coating the electrically conductive gate structure 120 and maintaining the reentrant profile 140 as shown in FIGS. 31a and 31b. As shown, the conformal insulating layer 130 is patterned so a portion of conformal gate layer 125 remains uncovered by the conformal insulating layer 130 allowing for access.

FIGS. 32a and 32b illustrate the result of Step 884 in FIG. 17, a conformal semiconductor layer 150 on the conformal insulating layer 130. The conformal semiconductor layer 150 is at least present in the first reentrant profile 140 of the electrically conductive gate structure 120, and can be said to maintain this profile. Forming the conformal semiconductor layer 150 is preferably done using an ALD process, more preferably using a spatial ALD process. As shown in FIGS. 32a and 32b, the conformal semiconductor layer 150 can be patterned. Patterning the conformal semiconductor layer 150 can be done using any method known in the art, including photolithography or selected area deposition FIGS. 33a and 33b illustrate the result of Step 890 in FIG. 17, simultaneously forming a first electrode 180 over the post 20 and cap 30 and a second electrode 170 not over the post. As shown, the second electrode 170 is adjacent to the first reentrant profile 140, and the second electrode 170 and first electrode 180 form the channel of the first transistor 100. Since the first electrode 180 and the second electrode 170 are formed simultaneously they have the same material composition. In a preferred embodiment the first electrode 180 and the second electrode 170 also have the same material thickness. The simultaneous formation of the first electrode 180 and the second electrode 170 can be accomplished using a line-of-sight deposition process or a selective area deposition process as describe in relationship to Step 880 of FIG. 12. The completed vertical transistors 100 and 200 shown in FIGS. 20a and 20b are equivalent (and identical) to the vertical transistors of FIGS. 1a and 1b.

EXAMPLES

General Conditions for the Preparation of Layers Using Atmospheric Pressure ALD

Figure 34:
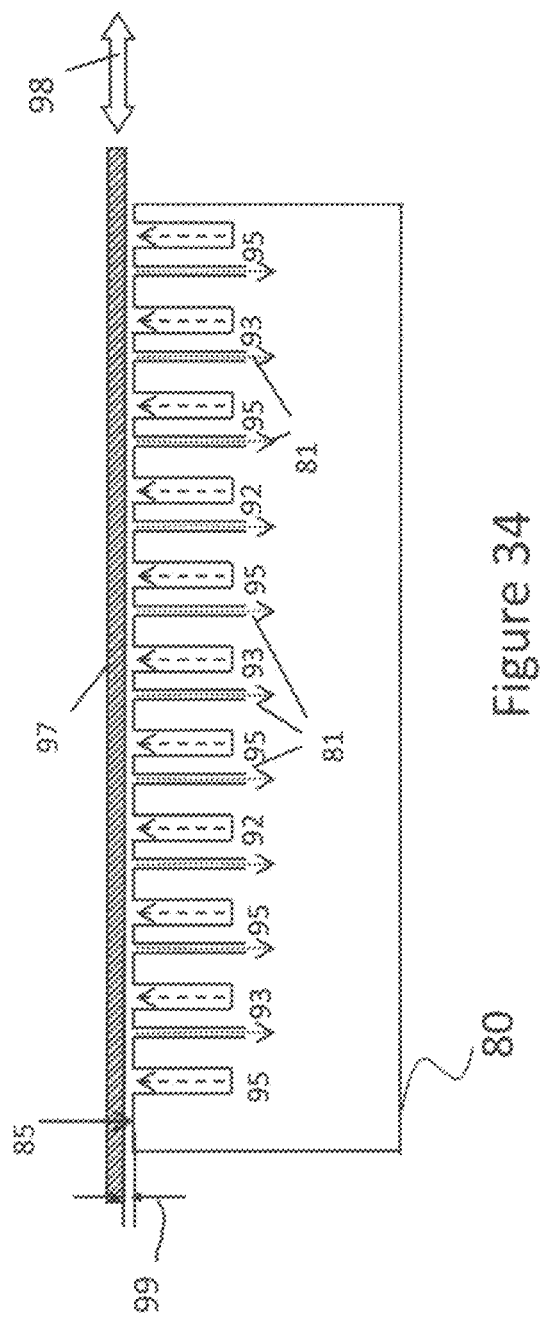
FIG. 34 is a schematic cross-sectional side view of a deposition device illustrating a spatial atomic layer deposition tool used in the Examples.

This describes the preparation of a thin film coating of the material layers on glass substrates as used in the examples. The ALD coating device used to prepare these layers, namely aluminum oxide, ZnO:N, and Al-doped ZnO (AZO), has been described in detail in US Patent Application Publication No. US 2009/0130858, the disclosure of which is incorporated by reference herein in its entirety. The coating device has an output face (facing up) that contains spatially separated elongated gas channels and operates on a gas bearing principle. The coating device can be understood with respect to delivery head 80 shown in FIG. 34. Each gas channel is composed of an output slot 95, 93, 92 which supplies gas to the output face 85, and adjacent exhaust slots 81 which remove gas from the output face 85. The order of the gas channels is P-O-P-M-P-O-P-M-P-O-P where P represents a purge channel, O represents a channel containing an oxygen based precursor, and M represents a channel containing a metal based precursor. As a substrate moves relative to the coating head it sees the above sequence of gases which effects and ALD deposition.

A 2.5×2.5 inch square (62.5 mm square) glass substrate attached to a heated backer is positioned on the output face of the coating device and is maintained in close proximity to the output face by an equilibrium between the flow of the gases supplied to the output face and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were trimethylaluminum (TMA), dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the coating was established by controlling heating both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating the coating head across the substrate for the number of cycles necessary to obtain a uniform deposited film of the desired thickness for the given example. The coating head as described above contains two full ALD cycles (two oxygen and two metal exposures per single direction pass over the head), therefore a round trip oscillation represents 4 ALD cycles. The cycle time for each ALD cycle was 200 ms, indicating a residence time of 50 ms for each gas exposure.

TABLE 1

| Layer | DMAI flow (sccm) | DEZ flow (sccm) | NH3 flow (sccm) | Water flow (sccm) | TMA flow (sccm) | $N_2$ dilution with Metal Alkyl (sccm) | $N_2$ dilution with water (sccm) | $N_2$ Inert Purge (sccm) | Substrate Temperature, °C. |
|---|---|---|---|---|---|---|---|---|---|
| Aluminum oxide | 0 | 0 | 0 | 22.5 | 30 | 1500 | 2250 | 3000 | 200 |

TABLE 1-continued

| Layer | DMAI flow (sccm) | DEZ flow (sccm) | NH3 flow (sccm) | Water flow (sccm) | TMA flow (sccm) | N$_2$ dilution with Metal Alkyl (sccm) | N$_2$ dilution with water (sccm) | N$_2$ Inert Purge (sccm) | Substrate Temperature, °C. |
|---|---|---|---|---|---|---|---|---|---|
| (TMA) | | | | | | | | | |
| ZnO:N | 0 | 60 | 4 | 45 | 0 | 1500 | 2250 | 3000 | 200 |
| AZO | 10 | 30 | 0 | 22.5 | 0 | 1500 | 2250 | 3000 | 200 |

Inventive Example I1

Molybdenum Gate Structure with Self-Aligned Gate Layer

Inventive Example I1 was fabricated using the process flows of FIG. 14 and of FIG. 15a to produce the two vertical TFTs schematically illustrated in FIGS. 1a and 1b. A piece of clean glass was used as the substrate (Step 810), and was coated uniformly with 500 nm of molybdenum metal by sputtering to form a thick electrically conductive layer on the surface of the substrate (Step 900). A 100 nm layer of AZO was formed on the molybdenum by the S-ALD process using precursors as laid out in Table 1, with substrate held at 200° C. The AZO layer was patterned by standard photolithography, using Dow S1813 photoresist to protect portions of the AZO. The unprotected portions of the AZO layer were then etched in a dilute acetic acid solution to form a patterned inorganic layer on the thick electrically conductive molybdenum layer (Step 910.). The photoresist was then stripped. (The cross section in FIG. 19a shows the sample at this stage schematically.) The remaining AZO acts as a hard mask for the plasma etching of the molybdenum layer. The sample was placed in an SF$_6$ plasma (200 W at a pressure of 0.3 Torr) to etch the molybdenum where it is not protected by the AZO, and then etched further to slightly undercut the AZO hard mask, creating a reentrant profile (Steps 920 and 820, as illustrated in FIG. 20a schematically).

The substrate including the gate structure with reentrant profile was then conformally coated with a second AZO layer, also 100 nm thick, using the same S-ALD conditions as the first (Step 830, as illustrated in FIG. 21a.)

A layer of PMMA was spin-coated over the substrate at 2000 RPM and baked at 180° C. for 1 minute (Step 840, as illustrated by FIG. 22a). The sample was then exposed to light including wavelengths of 185 nm, incident from a direction primarily orthogonal to the substrate and from the side of the resist opposite the substrate (as illustrated in FIG. 23a). The PMMA in the reentrant profile of the gate edge, where it was shadowed by the AZO which is not transparent to the 185 nm light, was not exposed (Step 850). Thus when the sample was developed in MIBK, the PMMA was removed everywhere on the substrate except in a portion of the reentrant profile (Step 860, as illustrated by FIG. 24a).

The sample was then immersed in a dilute acetic acid solution to etch the 100 nm of AZO not protected by the PMMA. The AZO in the reentrant profile region was protected by PMMA (Step 870). The PMMA was then removed by a combination of solvents and an oxygen plasma etch (Step 880, as illustrated by FIG. 30.)

The remaining processing steps to form transistors on the gate structure follow the process flow outlined in FIG. 17. The substrate, including the electrically conductive gate structure having a reentrant profile with a conductive gate layer formed above, was conformally coated by S-ALD with an insulating layer of aluminum oxide using TMA as metal precursor, and with a semiconductor layer of nitrogen-doped ZnO (ZnO:N), with precursor flow rates as in Table 1 (Steps 882 and 884, as illustrated by FIGS. 31a and 32a.)

The sample was then placed in a vacuum chamber for a blanket coating of thermally evaporated aluminum (Al) to be deposited in a direction essentially orthogonal to the substrate direction. This deposits Al both over the gate structure and on regions not on the post, simultaneously (Step 890, as illustrated by FIG. 33a). The directionality of the deposition prevents the Al from being deposited within reentrant profile, and forms the separation between the electrodes that will become the transistor channel.

The layer of Al and the blanket layer of semiconductor layer were then patterned into individual devices by photolithography. First a layer of PMMA was spin-coated at 3 k RPM and hot-plate baked for 1 minute at 180° C. Then a layer of S1813 resist was coated at 3 k RPM and baked for 1 minute at 110° C. The S1813 resist was patterned using exposure through a mask with rectangular openings approximately 20 microns wide by 600 microns long, with the long direction aligned to cross the gate pattern. After developing the S1813, the exposed regions of PMMA were plasma etched in an oxygen plasma at 100 W, 0.3 Torr for 6 minutes. The Al layer thus exposed and the ZnO:N layer below that, were then simultaneously etched in a standard combination of phosphoric, acetic, and nitric acids known as PAN etch. This resulted in the electrode configuration illustrated schematically in the plan view of FIG. 1b consisting of 170, 180, and 175. The photoresist was then stripped to make measurements with probes easier.

Figure 35:
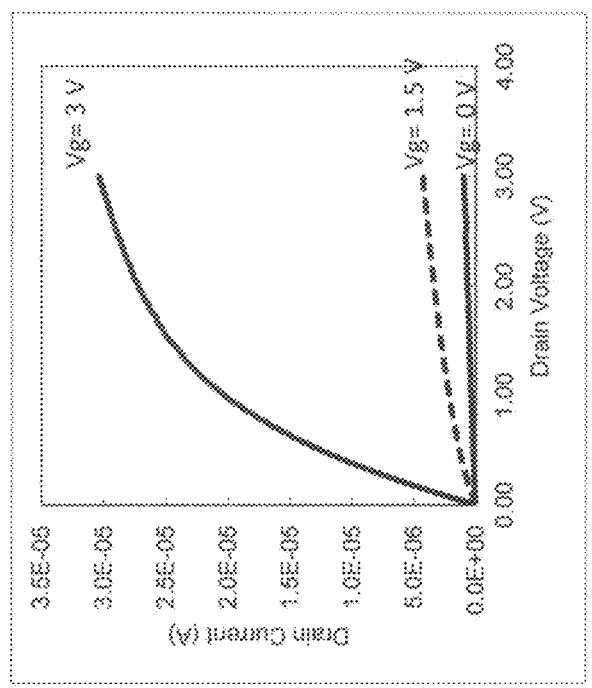
FIG. 35 is a graph showing the transistor characteristics of a vertical transistor made using an example embodiment of a process of the present invention.

Testing of the transistors was accomplished by using a probe station to contact the Al on one side of the gate structure (e.g. electrode 170), the Al on the other side of the gate structure (e.g. 175), and the conductive gate structure itself. This is equivalent to measuring transistor 100 and transistor 200 (FIG. 1a) in series. Referring to FIG. 35, a graph showing $I_{ds}$-$V_{ds}$ performance characteristics for the paired transistors of the invention with a channel width of 20 micrometers is shown. Curves corresponding to gate voltages of 0, 1.5, and 3.0 volts can be seen. As can be seen in FIG. 35, the drain current versus drain voltage is very responsive to the gate voltage. The electrodes, though deposited in one step, are not connected to each other, but function as distinct source and drain electrodes.

Inventive Example I2

Polymer Post and Cap with Additional Conductor Below

Inventive Example I2 was fabricated using the process flows of FIG. 14 and of FIG. 15b to produce the electrically conductive gate structure having a reentrant profile with a conductive gate layer schematically illustrated in FIG. 12. A piece of clean glass was coated uniformly with 70 nm of Al, and then patterned using standard photolithography and etching to leave lines of Al on the glass. The resist was stripped using solvents and oxygen plasma. The glass with Al lines patterned on it served as the substrate (Step 810).

A layer of MicroChem SU-8 2010, diluted to 30% by weight in PGMEA, was spin coated on the substrate. The SU-8 layer had a pre-exposure bake on a hot plate for 1 minute at 95° C., was blanket exposed using a Cobilt aligner without a mask, had a post-exposure bake again at 95° C., and a hard bake at 200° C. for 5 minutes (Step 960). The thickness of the SU-8 structural polymer was approximately 500 nm thick.

The sample was given a brief oxygen plasma, at 100 W, 0.3 Torr for 30 seconds, and then coated with a 100 nm layer of aluminum oxide using TMA as metal precursor, with precursor flow rates as in Table 1. This inorganic thin film on the structural polymer SU-8 was then patterned as follows. Photoresist S1813 was spin-coated on the sample and baked at 110° C. for 1 minute. The sample was then exposed without the use of an external mask, through the substrate and the structures formed on the substrate surface, with the photoresist side down (away from the light) and the back of the glass substrate up (closest to the light). This means the S1813 photoresist was exposed only where the there were no aluminum lines on the glass. After development, S1813 only remained in a pattern aligned to the aluminum stripes on the substrate, and the aluminum oxide not protected by the S1813 was etched in a 60° C. phosphoric acid bath (Step 960 in FIG. 15*b*.)

The SU-8 layer was etched using a 300 W oxygen plasma at 0.4 Torr for 6 minutes, which etched through the SU-8 polymer where it was not covered by the aluminum oxide cap, and also etched about 500 nm under the aluminum oxide cap, forming a reentrant profile (Step 970 and Step 820.)

Figure 36:
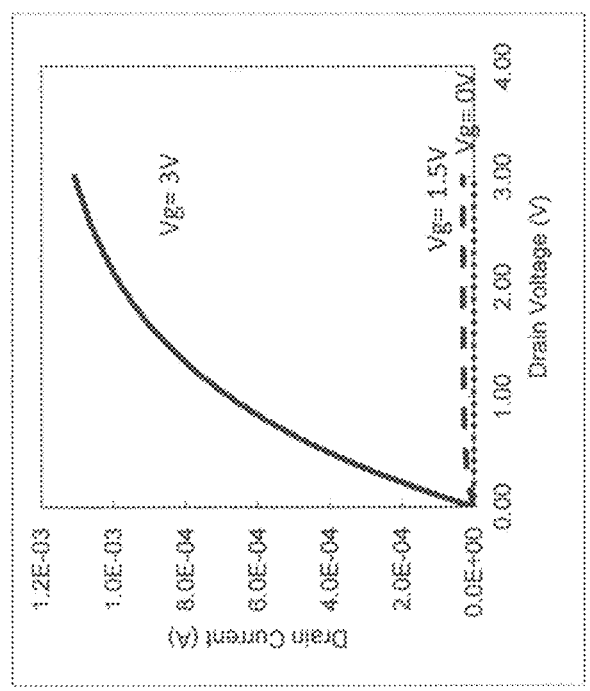
FIG. 36 is a graph showing the transistor characteristics of a vertical transistor made using another example embodiment of a process of the present invention.

Inventive Example I2 as then completed as Inventive Example I1. Testing of the Inventive Example I2 was accomplished by using a probe station to contact the Al on one side of the gate structure, the Al on the other side of the gate structure, and the conductive gate structure itself. This is equivalent to measuring the transistors on each side of the gate structure in series. Referring to FIG. 36, a graph showing $I_{ds}$-$V_{ds}$ performance characteristics for the paired transistors of the invention with a channel width of 100 micrometers is shown. Curves corresponding to gate voltages of 0, 1.5, and 3.0 volts can be seen. As can be seen in FIG. 36, the drain current versus drain voltage is very responsive to the gate voltage. The electrodes, though deposited in one step, are not connected to each other, but function as distinct source and drain electrodes.

The invention has been described in detail with particular reference to certain preferred embodiments thereof, but it will be understood that variations and modifications can be effected within the scope of the invention.

PARTS LIST 20 post
22 thick material layer
25 width of post
30 cap
40,47 side wall, edge
41 resist
43 resist
45 second edge
50 structural polymer layer
52 combined height of post and cap
57 patterned inorganic thin film
70 printed patterned inhibitor layer
75 region where the inhibitor material is not present
77 print pattern
80 delivery head
81 exhaust channels
85 output face
92 metal precursor flow
93 oxidizer-containing flow
95 nitrogen purge flow
97 example substrate
98 arrow
99 gap
100 vertical transistor
102 vertical transistor
103 vertical transistor
104 prior art vertical transistor
107 vertical transistor
110 substrate
115 conformal dielectric material layer
120 electrically conductive gate structure
121 gate structure
122 conductive material layer
125 electrically conductive gate layer
127 conformal conductive inorganic thin film
130 conformal insulating layer
140 reentrant profile
144 simple two line pattern
145 reentrant profile
148 resultant resist pattern
150 conformal semiconductor layer
170 second electrode
175 third electrode
180 first electrode
200 vertical transistor
202 vertical transistor
203 vertical transistor
204 prior art vertical transistor
207 vertical transistor
225 conductive gate layer
325 conductive gate layer
330 insulating material layer
340 first reentrant profile
345 second reentrant profile
350 semiconductor material layer
370 second electrode
375 third electrode
380 first electrode
405 ungated region
410 substrate
420 conductive gate structure
430 dielectric layer
440 reentrant profile
445 reentrant profile
450 semiconductor layer
470 electrode
475 electrode
480 electrode
500 gate
550 gate
702 top portion
704 bottom portion
720 post
725 conductive gate layer
730 conformal dielectric layer
750 conformal semiconductor layer 740 reentrant profile
745 reentrant profile
752 height of post
770 second electrode
775 third electrode
780 first electrode
800 forming an electrically conductive gate structure
810 provide a substrate
820 providing a gate structure having a reentrant profile
830 depositing a conformal conductive inorganic thin film
840 depositing a photoresist
845 printing a polymeric resist
850 exposing the photoresist
855 optionally exposing the photoresist
860 optionally developing the photoresist
865 optionally developing the photoresist
870 etching the conductive inorganic thin film
880 removing the photoresist from the reentrant profile
882 forming a conformal insulating layer
884 forming a conformal semiconductor layer
890 simultaneously forming first and second electrodes
900 providing a thick electrically conductive layer
910 forming a patterned inorganic thin film
920 etching the thick electrically conductive layer
950 providing a structural polymer
960 forming a patterned inorganic thin film
970 etching the structural polymer layer
h height
d depth
t thickness
A,A' line
B,B' line
C,C' line
C1,C1' points
P,P' line

The invention claimed is:

1. A method of forming a gate layer of a thin film transistor comprising:
providing a substrate including a gate structure having a reentrant profile;
depositing a conformal conductive inorganic thin film over the gate structure;
printing a polymeric resist that wicks along the reentrant profile of the gate structure due to capillary action; and
etching the conformal conductive inorganic thin film in areas not protected by the polymeric resist to form a patterned conductive gate layer located in the reentrant profile of the gate structure.

2. The method of claim 1, further comprising treating the polymeric resist after printing the polymeric resist.

3. The method of claim 2, wherein treating the polymeric resist includes using an oxygen plasma process.

4. The method of claim 1, wherein printing the polymeric resist includes printing with an inkjet printing process or a flexographic printing process.

5. The method of claim 1, further comprising depositing another conformal dielectric layer on the gate structure before depositing the conformal conductive thin film.

6. The method of claim 1, further comprising exposing the polymeric resist from a side of the polymeric resist opposite the substrate such that the polymeric resist in the reentrant profile remains unexposed.

7. The method of claim 1, further comprising removing the polymeric resist after etching the conformal conductive inorganic thin film.

8. The method of claim 1, wherein providing the substrate includes providing a patterned conductive layer on the substrate prior to providing the gate structure.

* * * * *